United States Patent
Kim et al.

(10) Patent No.: US 10,838,260 B2
(45) Date of Patent: Nov. 17, 2020

(54) LIGHT CONTROLLING DEVICE AND METHOD FOR FABRICATING THE SAME

(71) Applicant: LG Display Co., Ltd., Seoul (KR)

(72) Inventors: Pureum Kim, Incheon (KR); JiYoung Ahn, Goyang-si (KR); Sunyoung Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/840,674

(22) Filed: Dec. 13, 2017

(65) Prior Publication Data

US 2018/0173039 A1 Jun. 21, 2018

(30) Foreign Application Priority Data

Dec. 15, 2016 (KR) .................. 10-2016-0171606

(51) Int. Cl.
*G02F 1/1339* (2006.01)
*G02F 1/1333* (2006.01)
(Continued)

(52) U.S. Cl.
CPC ........ *G02F 1/13394* (2013.01); *G02F 1/1334* (2013.01); *G02F 1/1341* (2013.01); *G02F 1/13725* (2013.01); *G02F 1/133377* (2013.01); *G02F 1/133351* (2013.01); *G02F 2001/13396* (2013.01); *G02F 2001/133388* (2013.01);
(Continued)

(58) Field of Classification Search
CPC ............. G02F 1/1334; G02F 1/133377; G02F 1/16757; G02F 1/1681; G02F 2001/133388; G02F 1/13394
See application file for complete search history.

(56) References Cited

U.S. PATENT DOCUMENTS 7,440,070 B2 10/2008 Seok et al.
2004/0246420 A1 12/2004 Morimoto et al.
(Continued)

FOREIGN PATENT DOCUMENTS

CN 1573447 A 2/2005
CN 1829934 A 9/2006
(Continued)

OTHER PUBLICATIONS

Chinese Office Action dated Jun. 30, 2020 issued in corresponding Patent Application No. 201711267522.8 w/Partial English Translation of Office Action and Search Report (17 pages).

*Primary Examiner* — Jessica M Merlin
(74) *Attorney, Agent, or Firm* — Polsinelli PC

(57) ABSTRACT

A light controlling device and a method for fabricating the same are disclosed, in which liquid crystals and dichroic dyes may uniformly be distributed on a liquid crystal layer, and adhesion between upper and lower substrates may be improved. The light controlling device comprises first and second substrates facing each other; liquid crystal cells arranged between the first substrate and the second substrate, including liquid crystals; and a barrier arranged between the first substrate and the second substrate, partitioning the liquid crystal cells. The barrier includes a first barrier arranged in a first area to have a first pitch and a second barrier arranged in a second area surrounding the first area to have a second pitch.

14 Claims, 15 Drawing Sheets

(51) Int. Cl.
 *G02F 1/137* (2006.01)
 *G02F 1/1334* (2006.01)
 *G02F 1/1341* (2006.01)
 *H01L 51/52* (2006.01)
 *H01L 27/32* (2006.01)

(52) U.S. Cl.
 CPC .... *G02F 2202/043* (2013.01); *G02F 2203/01* (2013.01); *H01L 27/3211* (2013.01); *H01L 27/3246* (2013.01); *H01L 51/5206* (2013.01)

(56) References Cited

U.S. PATENT DOCUMENTS

| | | | |
|---|---|---|---|
| 2005/0243261 A1* | 11/2005 | Chiang | G02F 1/133514 349/155 |
| 2006/0227262 A1* | 10/2006 | Penterman | G02F 1/133377 349/84 |
| 2007/0268446 A1 | 11/2007 | Jeng et al. | |
| 2016/0062157 A1 | 3/2016 | Kim et al. | |

FOREIGN PATENT DOCUMENTS

| | | |
|---|---|---|
| CN | 101078830 A | 11/2007 |
| CN | 101661197 A | 3/2010 |
| CN | 105388658 A | 3/2016 |
| JP | 2000-221513 A | 8/2000 |
| TW | 200535500 A | 11/2005 |

\* cited by examiner

US 10,838,260 B2

LIGHT CONTROLLING DEVICE AND METHOD FOR FABRICATING THE SAME

CROSS REFERENCE TO RELATED APPLICATION

This application claims the benefit of the Korean Patent Application No. 10-2016-0171606 filed on Dec. 15, 2016, which is hereby incorporated by reference for all purposes as if fully set forth herein.

BACKGROUND

Field of the Disclosure

The present disclosure relates to a display device, and more particularly, to a light controlling device, a transparent display device including the same, and a method for fabricating the same.

Description of the Background

Recently, with the advent of the information age, display devices for processing and displaying a large amount of information have been promptly developed. More particularly, various display devices have been introduced and spotlighted. Detailed examples of the display devices include liquid crystal display (LCD) devices, plasma display panel (PDP) devices, field emission display (FED) devices, electroluminescence display (ELD) devices, and organic light emitting diodes (OLED).

Recently, the display devices have excellent properties of a thin profile, light weight and low power consumption and thus their application fields have been increased continuously. In particular, in most of electron devices or mobile devices, the display device has been used as one of user interfaces.

Also, studies of a transparent display device through which a user may see objects or images disposed on the rear surface of the display device have been actively made. The transparent display device may have advantages of better use of space, interior and design, and may have various application fields. The transparent display device may solve spatial and temporal restrictions of the existing electronic devices by realizing functions of information recognition, information processing and information display through a transparent electronic device. For example, the transparent display device may be applied to a window of a building or a car, and thus may be used as a smart window that allows a background to be seen or displays an image.

The transparent display device may be realized as an organic light emitting display device, and in this case, the transparent display device has an advantage of low power consumption. However, although the transparent display device has no problem in a contrast ratio under a dark environment, a problem occurs in that a contrast ratio is deteriorated under lighting. A contrast ratio of a dark environment may be defined as a dark room contrast ratio while a contrast ratio under lighting may be defined as a bright room contrast ratio. That is, since the transparent display device includes a transmissive area to allow a user to view an object or background disposed on a rear surface, a problem occurs in that a bright room contrast ratio is deteriorated. Therefore, if the transparent display device is realized as the organic light emitting display device, a light controlling device, which includes a light shielding mode shielding light and a transmissive mode transmitting light, is required to prevent a bright room contrast ratio from being deteriorated.

FIG. 1 is a plan view illustrating a light controlling device of the related art, and FIG. 2 is a cross-sectional view along line I-I' of FIG. 1.

Referring to FIGS. 1 and 2, the light controlling device of the related art may include a first substrate 10, a second substrate 20, a first electrode 30 arranged on the first substrate 10, a second electrode 40 arranged on the second substrate 20, a liquid crystal layer transmitting or shielding light by using liquid crystals and dichroic dyes arranged between the first electrode 30 and the second electrode 40, and spacers 60 for maintaining a gap of the liquid crystal layer 50.

The spacers 60 formed in the light controlling device of the related art serve to maintain the gap of the liquid crystal layer 50 but fail to completely separate the liquid crystal layer 50. Therefore, the light controlling device has a problem in that the liquid crystals and the dichroic dyes of the liquid crystal layer 50 are concentrated on the bottom by gravity. As a result, the liquid crystals and the dichroic dyes are unevenly distributed in the liquid crystal layer 50. For this reason, a light-shielding ratio of the liquid crystal layer 50 is not uniform in a light-shielding mode, thereby a problem occurs in that light-shielding is not realized normally.

Meanwhile, in the light controlling device of the related art, the first substrate 10 and the second substrate 20 are bonded to each other by a sealant 70 formed at an edge area. In more detail, the light controlling device of the related art coats the sealant 70 on the first substrate 10 and bonds the second substrate 20 to the first substrate 10 coated with the sealant 70. At this time, the light controlling device further includes a dam 80 to prevent the sealant 70 from flowing inwardly or outwardly because the sealant 70 is in a liquid state.

As described above, the light controlling device of the related art has a problem in that adhesion between the first substrate 10 and the second substrate 20 is weak because the sealant 70 is coated only on the edge area to bond the first substrate 10 and the second substrate 20 to each other. Moreover, if a transparent display device is realized to have a large size, it is likely that an adhesive defect between the first substrate 10 and the second substrate 20 can occur.

Also, in the light controlling device of the related art, the sealant 70 is coated between two dams 80, and in this case, the sealant 70 may not be filled fully between the dams 80, thereby a step difference may occur. In this case, since the second substrate 20 is not in contact with the sealant 70, a problem occurs in that an adhesive defect between the first substrate 10 and the second substrate 20 is caused.

On the contrary, the light controlling device of the related art, the sealant 70 may overflow outside the dams 80, thereby the sealant 70 may enter the liquid crystal layer 50. In this case, another problem may occur in that a light-shielding ratio and a transmissive ratio of the liquid crystal layer 50 are deteriorated.

Also, in the light controlling device of the related art, since the dams 80 and the sealant 70 should be formed on the edge area, there is limitation in reducing a thickness of a bezel.

SUMMARY

Accordingly, the present disclosure is directed to a light controlling device and a method for fabricating the same, which substantially obviate one or more problems due to limitations and disadvantages of the related art.

An advantage of the present disclosure is to provide a light controlling device and a method for fabricating the same, in which liquid crystals and dichroic dyes may uniformly be distributed on a liquid crystal layer.

Another advantage of the present disclosure is to provide a light controlling device and a method for fabricating the same, in which adhesion between a first substrate and a second substrate may be improved.

Other advantage of the present disclosure is to provide a light controlling device and a method for fabricating the same, in which a bezel thickness may be minimized.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these features and other advantages and in accordance with the purpose of the disclosure, as embodied and broadly described herein, a light controlling device according to one aspect of the present disclosure comprises first and second substrates facing each other; liquid crystal cells arranged between the first substrate and the second substrate, including liquid crystals; and a barrier arranged between the first substrate and the second substrate, partitioning the liquid crystal cells, wherein the barrier includes a first barrier arranged in a first area to have a first pitch and a second barrier arranged in a second area surrounding the first area to have a second pitch.

In another aspect of the present disclosure, a method for fabricating a light controlling device according to another aspect of the present disclosure comprises the steps of depositing a liquid crystal mixture containing liquid crystals and a monomer on one surface of a first substrate; arranging a second substrate on the liquid crystal mixture; and forming a first barrier having a first pitch in a first area and a second barrier having a second pitch in a second area by hardening the monomer contained in the liquid crystal mixture to a polymer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
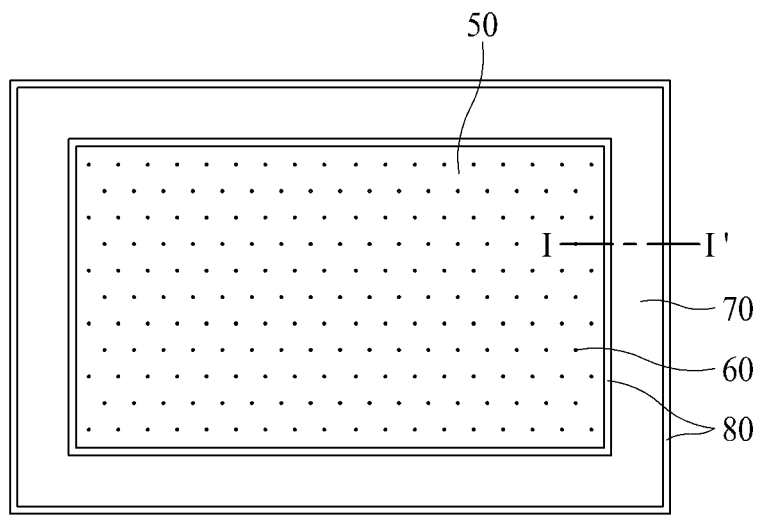
FIG. 1 is a plan view illustrating a light controlling device of the related art.
Figure 2:
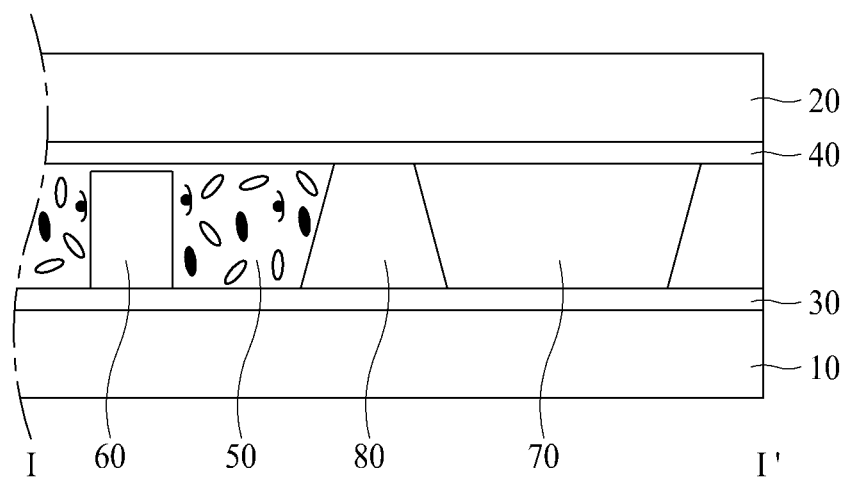
FIG. 2 is a cross-sectional view along line I-I' of FIG. 1.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the present disclosure will be described in detail with reference to the accompanying drawings.

Figure 3:
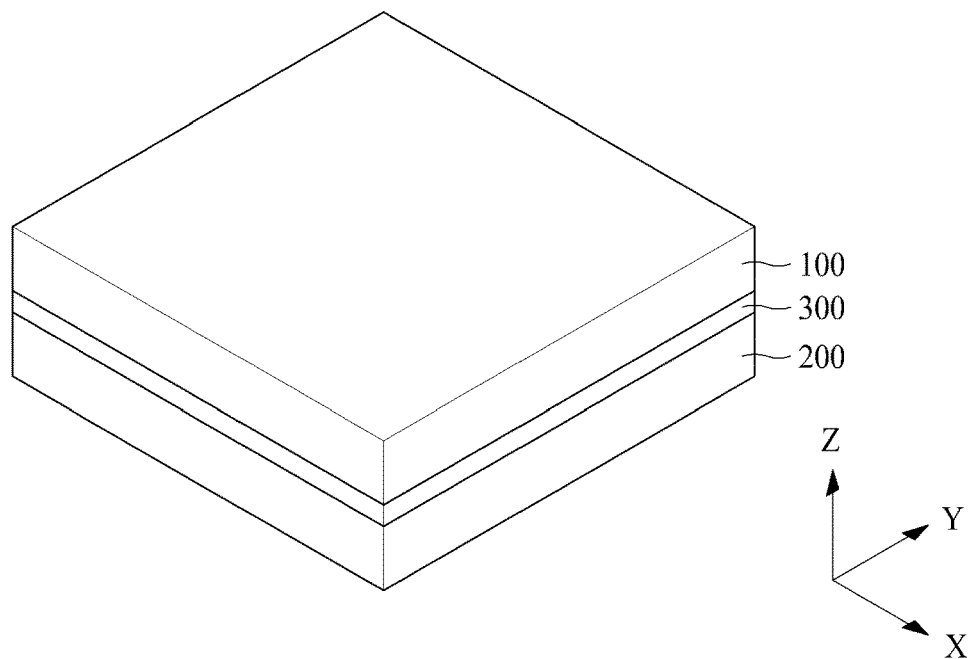
FIG. 3 is a perspective view illustrating a transparent display device according to the aspect of the present disclosure.
Figure 4:
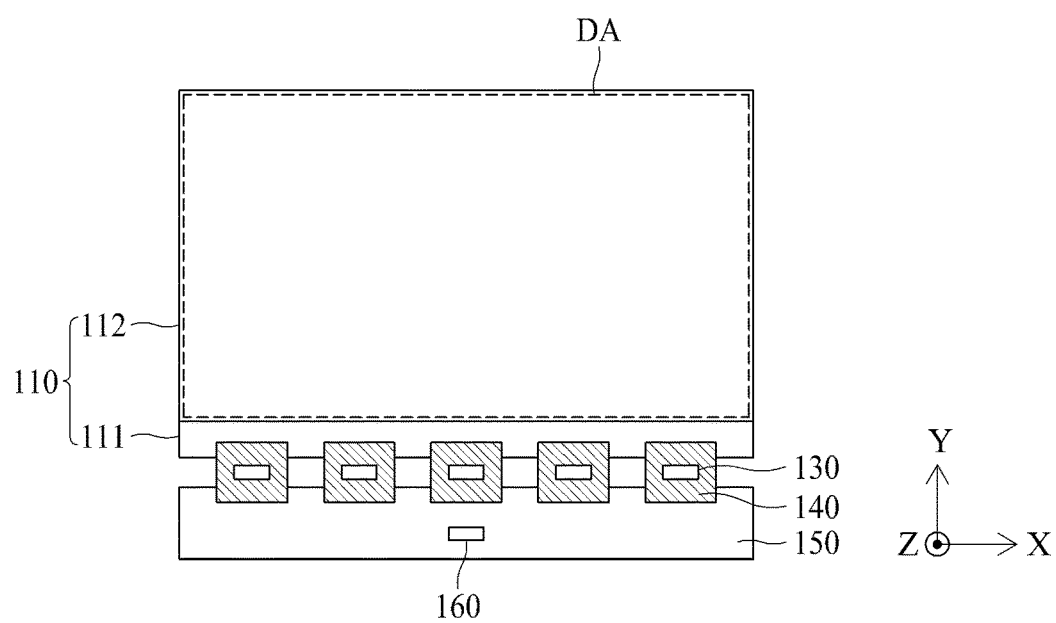
FIG. 4 is a plan view illustrating a transparent display panel, a source drive IC, a flexible film, a circuit board, and a timing controller of a transparent display device according to the aspect of the present disclosure.
Figure 5:
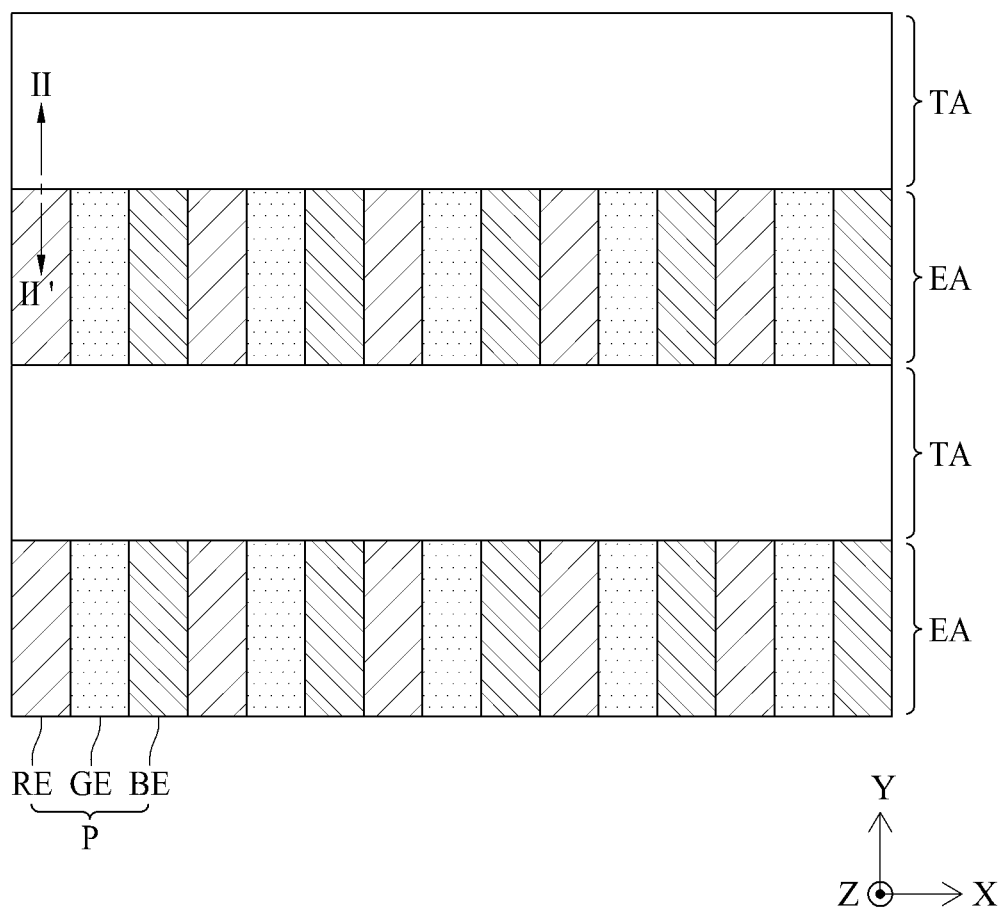
FIG. 5 is an exemplary view illustrating a transmissive area and a light-emission area of a display area of FIG. 4.
Figure 6:
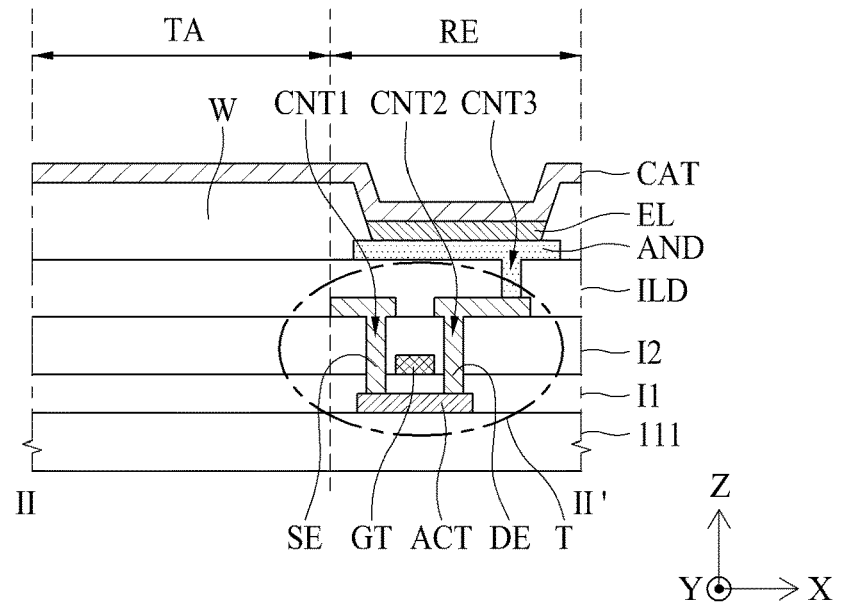
FIG. 6 is a cross-sectional view along line II-II' of FIG. 5.
Figure 7:
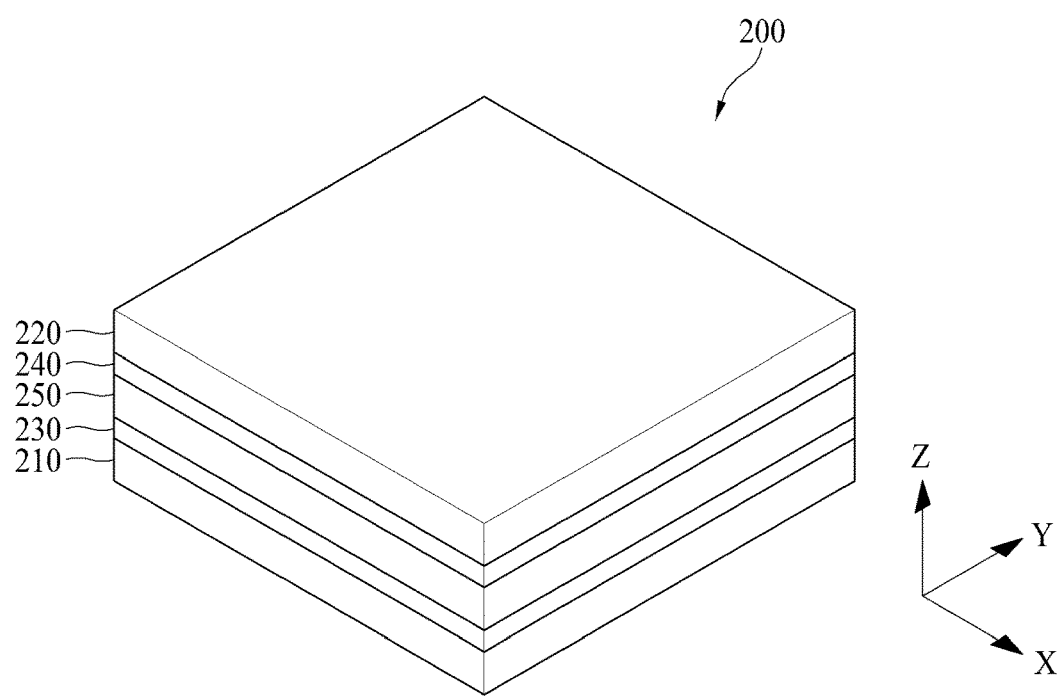
FIG. 7 is a detailed perspective view illustrating a light controlling device according to the aspect of the present disclosure.

FIG. 3 is a perspective view illustrating a transparent display device according to an aspect of the present disclosure. FIG. 4 is a plan view illustrating a transparent display panel, a source drive IC, a flexible film, a circuit board, and a timing controller of a transparent display device according to the aspect of the present disclosure. FIG. 5 is an exemplary view illustrating a transmissive area and a light-emission area of a display area of FIG. 4. FIG. 6 is a cross-sectional view along line II-II' of FIG. 5. FIG. 7 is a detailed perspective view illustrating a light controlling device according to the aspect of the present disclosure.

Hereinafter, a transparent display device according to the aspect of the present disclosure will be described in detail with reference to FIGS. 3 to 7. In FIGS. 3 to 7, for convenience of description, the X-axis direction is a direction parallel with a gate line, the Y-axis direction is a direction parallel with a data line, and the Z-axis direction is a height direction of the transparent display device.

Referring to FIGS. 3 to 7, the transparent display device according to the aspect of the present disclosure includes a transparent display panel 100, a gate driver (not shown), a source drive integrated circuit (hereinafter, referred to as "IC") 130, a flexible film 140, a circuit board 150, a timing controller 160, a light controlling device 200, and an adhesive layer 300.

Although the transparent display device according to the aspect of the present disclosure is described to be realized as an organic light emitting display device, the transparent display device may be realized as a liquid crystal display device or an electrophoresis display device.

The transparent display panel 100 includes a lower substrate 111 and an upper substrate 112. The upper substrate 111 may be an encapsulation substrate. The lower substrate 111 is formed to be greater than the upper substrate 112, thereby the lower substrate 111 may be partially exposed without being covered by the upper substrate 112.

The transparent display panel 100 transmits incident light or displays an image. Gate and data lines may be formed on a display area DA of the transparent display panel, and pixels P may be formed on areas where the gate lines cross the data lines. The pixels P of the display area DA may display images.

The display area DA includes transmissive areas TA and emission areas EA as shown in FIG. 5. The transparent display panel 100 may allow a user to view an object or background arranged on a rear surface of the transparent display panel 100 due to the transmissive areas TA, and may display images due to the emission areas EA. Although the transmissive areas TA and the emission areas EA are formed longitudinally along the gate lines (X-axis direction) in FIG. 5, the transmissive areas TA and the emission areas EA may be formed longitudinally along the data lines (Y-axis direction).

The transmissive area TA is an area for almost passing through incident light as it is. The emission area EA is an area for emitting light. The emission area EA may include a plurality of pixels P, each of which includes, but not limited to, a red emission portion RE, a green emission portion GE, and a blue emission portion BE as shown in FIG. 5. For example, each of the pixels P may further include a white emission portion in addition to the red emission portion RE, the green emission portion GE and the blue emission portion BE. Alternatively, each of the pixels P may include two or more of the red emission portion RE, the green emission portion GE, the blue emission portion, a yellow emission portion, a magenta emission portion, and a cyan emission portion.

The red emission portion RE is an area for emitting red light, the green emission portion GE is an area for emitting green light, and the blue emission portion BE is an area for emitting blue light. Each of the red emission portion RE, the green emission portion GE and the blue emission portion BE of the emission area EA emits predetermined light and corresponds to a non-transmissive area that does not transmit incident light.

Each of the red emission portion RE, the green emission portion GE and the blue emission portion BE may be provided with a transistor T, an anode electrode AND, an organic layer EL, and a cathode electrode CAT.

The transistor T includes an active layer ACT provided on the lower substrate 111, a first insulating film I1 provided on the active layer ACT, a gate electrode GE provided on the first insulating film I1, a second insulating film I2 provided on the gate electrode GE, and source and drain electrodes SE and DE provided on the second insulating film I2 and connected to the active layer ACT through first and second contact holes CNT1 and CNT2. The transistor T is formed, but not limited to, in a top gate type in which the gate electrode GE is arranged on the active layer ACT in FIG. 6. That is, the transistor T may be formed in a bottom gate type in which the gate electrode GE is arranged below the active layer ACT.

The anode electrode AND is connected to the drain electrode DE of the transistor T through a third contact hole CNT3 passing through an inter-layer dielectric (ILD) film provided on the source electrode SE and the drain electrode DE. A bank is provided between anode electrodes AND adjacent to each other, thereby the anode electrodes AND adjacent to each other may electrically be insulated from each other.

The organic layer EL is provided on the anode electrode AND. The organic layer EL may include a hole transporting layer, an organic light emitting layer, and an electron transporting layer. The cathode electrode CAT is provided on the organic layer EL and the bank W. If a voltage is applied to the anode electrode AND and the cathode electrode CAT, holes and electrons move to the organic layer EL through the hole transporting layer and the electron transporting layer, respectively, and are combined with each other in the organic layer EL to emit light.

Although the transparent display panel 100 is realized in a top emission type in FIG. 6, the transparent display panel 100 may be realized in a bottom emission type. In the top emission type, light of the organic layer EL is emitted toward the upper substrate, thereby the transistor T may be provided widely below the bank W and the anode electrode AND. Therefore, the top emission type has an advantage in that a design area of the transistor T is wider than that of the bottom emission type. In the top emission type, it is preferable that the anode electrode AND is formed of a metal material having high reflectivity such as Al and a deposition structure of Al and ITO, and the cathode electrode CAT is formed of a transparent metal material such as ITO and IZO.

As described above, each of the pixels P of the transparent display device according to the aspect of the present disclosure includes a transmissive area TA almost transmitting incident light as it is, and an emission area EA emitting light. As a result, according to the aspect of the present disclosure, the user may view an object or background arranged on the rear surface of the transparent display device through the transmissive areas TA of the transparent display device.

The gate driver (not shown) supplies gate signals to the gate lines in accordance with a gate control signal input from the timing controller 160. The gate driver may be formed in, but not limited to, a gate driver in panel (GIP) type outside one side of the display area DA of the transparent display panel 100. That is, the gate driver may be formed in a GIP type outside both sides of the display area DA of the transparent display panel 100. Alternatively, the gate driver may be fabricated of a driving chip, packaged in a flexible film and attached to the transparent display panel 100 in a tape automated bonding (TAB) type.

The source drive IC 130 receives digital video data and a source control signal from the timing controller 160. The source drive IC 130 converts the digital video data to analog data voltages in accordance with the source control signal and supplies the analog data voltages to the data lines. If the source drive IC 130 is fabricated of a driving chip, the source drive IC 130 may be packaged in the flexible film 140 in a chip on film (COF) or chip on plastic (COP) type.

Since the lower substrate 111 is greater than the upper substrate 112, the lower substrate 111 may partially be exposed without being covered by the upper substrate 112. Pads such as data pads may be provided in the part of the lower substrate 11 which is exposed without being covered by the upper substrate 112. Lines which connect the pads with the source drive IC 130 and lines which connect the pads with lines of the circuit board 150 may be formed in the flexible film 140. The flexible film 140 is attached onto the pads by using an anisotropic conducting film, thereby the pads may be connected with the lines of the flexible film 140.

The circuit board 150 may be attached to the flexible films 140. A plurality of circuits comprised of driving chips may be packaged in the circuit board 150. For example, the timing controller 160 may be packaged in the circuit board 150. The circuit board 150 may be a printed circuit board or a flexible printed circuit board.

The timing controller 160 receives digital video data and a timing signal from an external system board (not shown). The timing controller 160 generates a gate control signal for controlling an operation timing of the gate driver (not shown) and a source control signal for controlling the source drive ICs 130 on the basis of the timing signal. The timing controller 160 supplies the gate control signal to the gate driver (not shown), and supplies the source control signal to the source drive ICs 130.

The light controlling device 200 may shield incident light in a light-shielding mode, and may transmit incident light in a transmissive mode. The light controlling device 200 includes a first substrate 210, a second substrate 220, a first electrode 230, a second electrode 240, and a liquid crystal layer 250 as shown in FIG. 7.

Each of the first substrate 210 and the second substrate 220 may be a glass substrate or a plastic film. If each of the first substrate 210 and the second substrate 220 is a plastic film, each of the first substrate 210 and the second substrate 220 may be, but not limited to, a sheet or film that includes cellulose resin such as TAC (triacetyl cellulose) or DAC (diacetyl cellulose), COP (cyclic olefin polymer) such as norbornene derivatives, COC (cyclo olefin copolymer), acryl resin such as PMMA (poly(methylmethacrylate)), polyolefin such as PC (polycarbonate), PE (polyethylene) or PP (polypropylene), polyester such as PVA (polyvinyl alcohol), PES (poly ether sulfone), PEEK (polyetheretherketone), PEI (polyetherimide), PEN (polyethylenenaphthalate), and PET (polyethyleneterephthalate), PI (polyimide), PSF (polysulfone), or fluoride resin.

The first electrode 230 is provided on one surface of the first substrate 210 which faces the second substrate 220, and the second electrode 240 is provided on one surface of the second substrate 220 which faces the first substrate 210. Each of the first and second electrodes 230 and 240 may be a transparent electrode.

Each of the first and second electrodes 230 and 240 may be, but not limited to, silver oxide (e.g.; AgO or $Ag_2O$ or $Ag_2O_3$), aluminum oxide (e.g.; $Al_2O_3$), tungsten oxide (e.g.; $WO_2$ or $WO_3$ or $W_2O_3$), magnesium oxide (e.g.; MgO), molybdenum oxide (e.g.; $MoO_3$), zinc oxide (e.g.; ZnO), tin oxide (e.g.; $SnO_2$), indium oxide (e.g.; $In_2O_3$), chrome oxide (e.g.; $CrO_3$ or $Cr_2O_3$), antimony oxide (e.g.; $Sb_2O_3$ or $Sb_2O_5$), titanium oxide (e.g.; $TiO_2$), nickel oxide (e.g.; NiO), copper oxide (e.g; CuO or $Cu_2O$), vanadium oxide (e.g.; $V_2O_3$ or $V_2O_5$), cobalt oxide (e.g.; CoO), iron oxide (e.g; $Fe_2O_3$ or $Fe_3O_4$), niobium oxide (e.g; $Nb_2O_5$), Indium Tin Oxide (ITO), Indium Zinc Oxide (IZO), Aluminum doped Zinc Oxide (ZAO), Aluminum Tin Oxide (TAO) or Antimony Tin Oxide (ATO).

A first alignment film 253 is provided on one surface of the first electrode 230 which faces the second substrate 220.

A second alignment film 254 is provided on one surface of the second electrode 240 which faces the first substrate 210.

The liquid crystal layer 250 may be realized in a transmissive mode for transmitting incident light and a light-shielding mode for shielding incident light. In the aspect of the present disclosure, it may be assumed that the light-shielding mode indicates that light transmittance of the light controlling device 200 is smaller than α %, and the transmissive mode indicates that the light controlling device 200 is greater than β %. Light transmittance of the light controlling device 200 indicates a ratio of output light to light entering the light controlling device 200.

The liquid crystal layer 250 may be a guest host liquid crystal layer that includes liquid crystals and dichroic dyes. In this case, the liquid crystals may be host materials and the dichroic dyes may be guest materials. Alternatively, the liquid crystal layer 250 may be a polymer network liquid crystal layer that includes liquid crystals, dichroic dyes and a polymer network. In this case, the liquid crystal layer 250 may enhance scattering effect of incident light due to the polymer network. Alternatively, the liquid crystal layer 250 may be a dynamic scattering mode liquid crystal layer that includes liquid crystals, dichroic dyes and ion materials. In case of a dynamic scattering mode, if an alternating current voltage is applied to the first and second electrodes 230 and 240, the ion materials allow the liquid crystals and the dichroic dyes to randomly move. In this case, the light entering the liquid crystal layer 250 may be scattered by the liquid crystals which move randomly, or may absorbed by the dichroic dyes, thereby the light-shielding mode may be realized.

The adhesive layer 300 attaches the transparent display panel 100 to the light controlling device 200. The adhesive layer 300 may be a transparent adhesive film such as an optically clear adhesive (OCA), or a transparent adhesive such as an optically clear resin (OCR). In this case, the adhesive layer 300 may have a refractive index between 1.4 and 1.9 for refractive index matching between the transparent display panel 100 and the light controlling device 200.

If the light controlling device 200 is attached to a direction along which the transparent display panel 100 emits light, inconvenience tasks are required in that the light controlling device 200 should be patterned to form light-shielding areas and the light-shielding areas should be aligned to correspond to the transmissive areas TA of the transparent display panel 100. Therefore, it is preferable that the light controlling device 200 is attached to an opposite direction of the direction through which the transparent display panel emits light. For example, if the transparent display panel 100 is a top emission type, the light controlling device 200 is preferably arranged below the transparent display panel 100, that is, below the lower substrate 111. If the transparent display panel 100 is a bottom emission type, the light controlling device 200 is preferably arranged on the transparent display panel 100, that is, on the upper substrate 112.

Hereinafter, the liquid crystal layer 250 of the light controlling device 200 will be described in more detail with reference to FIGS. 8 to 20.

First Aspect

Figure 8:
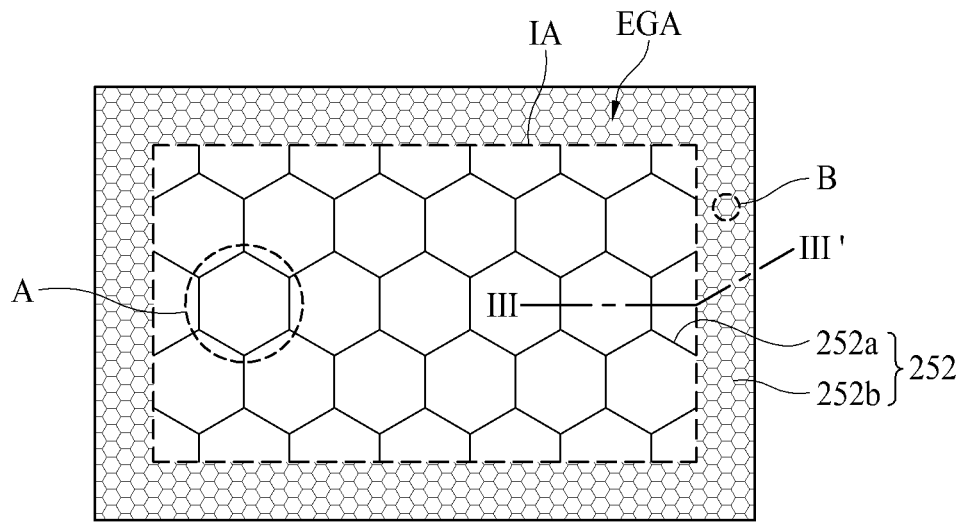
FIG. 8 is a plan view illustrating a first aspect of a liquid crystal layer shown in FIG. 7.
Figure 9:
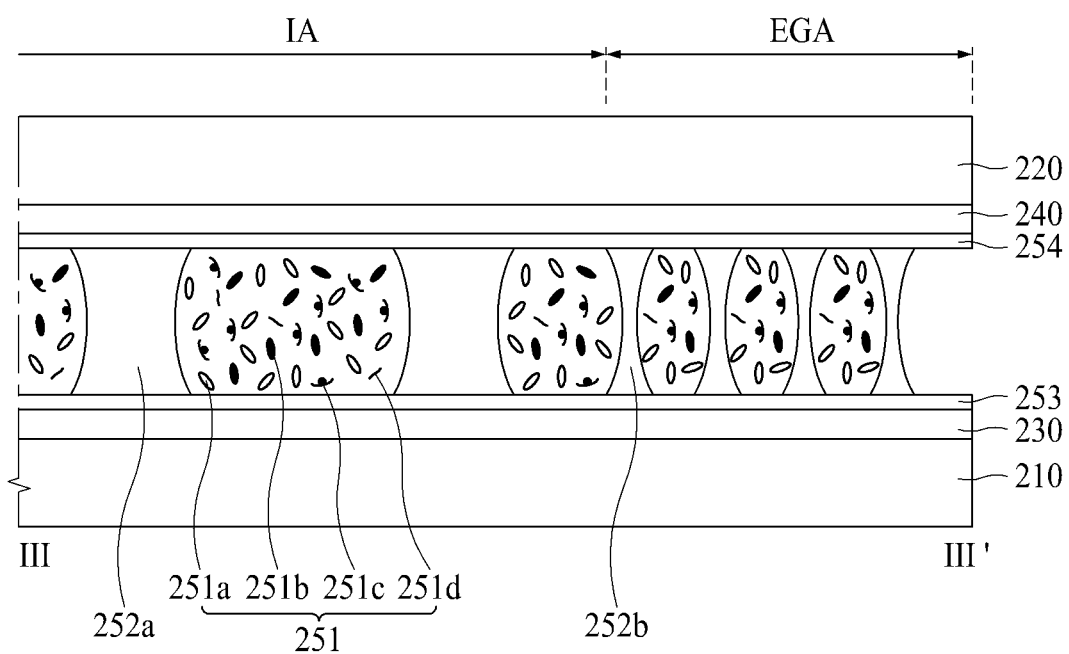
FIG. 9 is a cross-sectional view along line III-III' of FIG. 8.
Figure 10A:
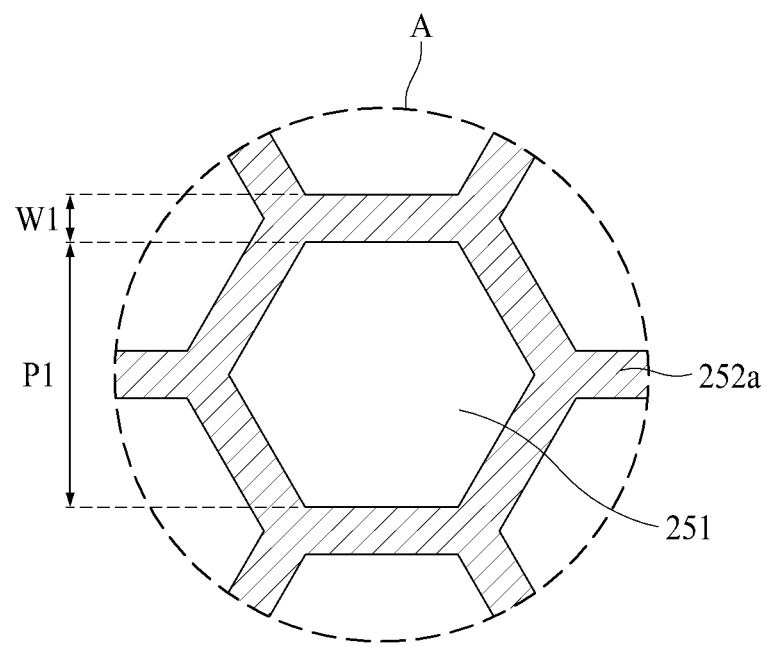
FIG. 10A is an enlarged view illustrating an area A of FIG. 8.
Figure 10B:
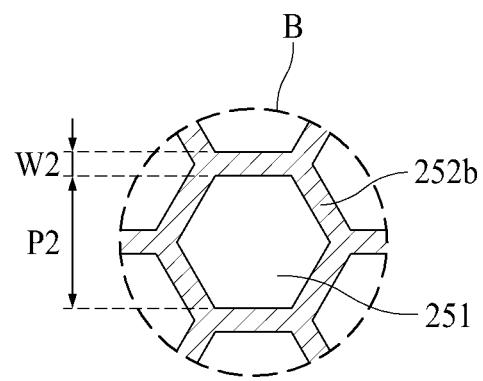
FIG. 10B is an enlarged view illustrating an area B of FIG. 8.

FIG. 8 is a plan view illustrating a first aspect of a liquid crystal layer shown in FIG. 7. FIG. 9 is a cross-sectional view along line III-III' of FIG. 8. FIG. 10A is an enlarged view illustrating an area A of FIG. 8. FIG. 10B is an enlarged view illustrating an area B of FIG. 8. For convenience of description, although the liquid crystal layer 250 is realized as a dynamic scattering mode liquid crystal layer, the liquid crystal layer 250 may be realized as various liquid crystal layers such as a guest host liquid crystal layer and a polymer network liquid crystal layer.

Referring to FIGS. 8 and 9, the liquid crystal layer 250 may include liquid crystal cells 251, barriers 252 (including 252a and 252b), a first alignment film 253 and a second alignment film 254.

The liquid crystal cells 251 include liquid crystals 251a, dichroic dyes 251b, ion materials 251c, monomers 251d, and a photo-initiator (not shown).

The long-axis directional liquid crystals 251a may be positive liquid crystals arranged in a vertical direction (Z-axis direction) by the first and second alignment films 253 and 254 even though no voltage is applied to the first and second electrodes 230 and 240. Likewise, the long-axis directional dichroic dyes 251b may also be arranged in a vertical direction (Z-axis direction) by the first and second alignment films 253 and 254 even though no voltage is applied to the first and second electrodes 230 and 240. Therefore, since the light controlling device 200 may be operated in the transmissive mode even though no voltage is applied thereto, it is advantageous that the transmissive mode may be realized without power consumption.

The dichroic dyes 251b may be dyes that can absorb light. For example, the dichroic dyes 251b may be black dyes that absorb every light of a visible ray wavelength range or dyes that absorb light except for a specific colored (for example, red) wavelength and reflect light of the specific colored (for example, red) wavelength. In the aspect of the present disclosure, the dichroic dyes 251b may be, but not limited to, black dyes. For example, the dichroic dyes 251b may be dyes that have any one color of red, green, blue and yellow or have a mixed color of red, green, blue and yellow. That is, in the aspect of the present disclosure, various colors may be displayed in the light-shielding mode and at the same time background may be shielded. For this reason, in the aspect of the present disclosure, since various colors may be provided in the light-shielding mode, a user may feel esthetic effect. For example, if the transparent display device according to the aspect of the present disclosure is applied to a smart window or public window, which may be used at a public place and requires a transmissive mode and a light-shielding mode, the transparent display device may shield light while displaying various colors in accordance with time or place.

The ion materials 251c serve to allow the liquid crystals and the dichroic dyes to randomly move. The ion materials 251c may have a predetermined polarity, thereby the ion materials 251c may move to the first electrode 230 or the second electrode 240 in accordance with a polarity of a voltage applied to each of the first electrode 230 and the second electrode 240. For example, if the ion materials 251c have a negative polarity, and if a positive polarity voltage is applied to the first electrode 230 and a negative polarity voltage is applied to the second electrode 240, the ion materials 251c move to the first electrode 230. Also, if the ion materials 251c have a negative polarity, and if a positive polarity voltage is applied to the second electrode 240 and a negative polarity voltage is applied to the first electrode 230, the ion materials 251c move to the second electrode 240. Also, if the ion materials 251c have a positive polarity, and if a positive polarity voltage is applied to the first electrode 230 and a negative polarity voltage is applied to the second electrode 240, the ion materials 251c move to the second electrode 240. Also, if the ion materials 251c have a positive polarity, and if a positive polarity voltage is applied to the second electrode 240 and a negative polarity voltage is applied to the first electrode 230, the ion materials 251c move to the first electrode 230. Therefore, if the voltage is applied to each of the first and second electrodes 230 and 240, the ion materials 251c repeatedly move from the first electrode 230 to the second electrode 240 and then return to the first electrode 230 at a predetermined cycle. In this case, the ion materials 251c move and collide with the liquid crystals 251a and the dichroic dyes 251b, thereby the liquid crystals 251a and the dichroic dyes 251b move randomly. The voltages applied to the first and second electrodes 230 may be alternating current voltages.

Alternatively, the ion materials 251c may give and take electrons in accordance with the polarities of the voltages applied to the first electrode 230 and the second electrode 240. Therefore, if an alternating current voltage having a predetermined cycle is applied to each of the first and second electrodes 230 and 240, the ion materials 251c give and take electrons at a predetermined cycle. In this case, since the electrons collide with the liquid crystals 251a and the dichroic dyes 251b while moving, the liquid crystals 251a and the dichroic dyes 251b move randomly. The voltages applied to the first and second electrodes 230 and 240 may be the alternating current voltages.

The light controlling device 200 according to the aspect of the present disclosure does not apply any voltage to the first and second electrodes 230 and 240 in the transmissive mode. In this case, the liquid crystals 251a and the dichroic dyes 251b of each of the liquid crystal cells 251 are arranged in a vertical direction (Z-axis direction) by the first and second alignment films 253 and 254. For this reason, since the liquid crystals 251a and the dichroic dyes 251b are arranged in an incident direction of light, scattering and absorption of light due to the liquid crystals 251a and the dichroic dyes 251b are minimized. Therefore, most of the light entering the light controlling device 200 may pass through the liquid crystal cells 251.

Also, the light controlling device 200 according to the aspect of the present disclosure applies an alternating current voltage having a predetermined cycle to the first and second electrodes 230 and 240 in the light-shielding mode. In this case, the liquid crystals 251a and the dichroic dyes 251b move randomly by means of movement of the ion materials 251c. As the liquid crystals 251a and the dichroic dyes 251b move randomly, light is scattered by the liquid crystals 251a or light is absorbed by the dichroic dyes 251b. Therefore, most of the light entering the light controlling device 200 may be shielded by the liquid crystal cells 251.

The barrier 252 is arranged between the first substrate 210 and the second substrate 220, and serves to partition the liquid crystal cells 251. In more detail, the barrier 252 has a closed structure to partition the liquid crystal cells 251. The barrier 252 may have a closed structure of which plane type surrounds an n-angulated (n is a positive integer of 3 or more) shape. For example, the barrier 252 may be formed along in a honeycomb pattern or along all sides of a hexagonal shape as shown in FIG. 8. Therefore, the barrier 252 may partition the area of which plane type has a hexagonal shape. At this time, the area partitioned by the barrier 252 may correspond to one liquid crystal cell 251, and has a closed structure which is not connected with other adjacent liquid crystal cells 251.

As described above, in the present disclosure, the barrier 252 is formed by a closed structure not an opened structure such as a stripe, thereby the liquid crystals 251a and the dichroic dyes 251b included in one liquid crystal cell 251 may be prevented from moving to another adjacent liquid crystal cell 251 by gravity. Therefore, the liquid crystals 251a and the dichroic dyes 251b may be distributed uniformly without being concentrated on one side.

As a result, in the present disclosure, a ratio of the liquid crystals 251a and the dichroic dyes 251b may be maintained uniformly in the light controlling device 200 by the barrier 252. For example, there may be a difference in a ratio of the liquid crystals 251a and the dichroic dyes 251b between the liquid crystal cells 251 in the range of 1% or less. If there is a difference in a ratio of the liquid crystals 251a and the dichroic dyes 251b between the liquid crystal cells 251 in the range greater than 1%, there may be a difference in light transmittance of the transmissive mode and a light-shielding ratio of the light-shielding mode between the liquid crystal cells 251.

The barrier 252 includes a first barrier 252a arranged in a first area IA and a second barrier 252b arranged in a second area EGA.

The first barrier 252a is arranged in the first area IA. At this time, the first area IA indicates an inner area as shown in FIG. 8. The first barrier 252a has a first pitch P1 and a first width W1 as shown in FIG. 10A. In this case, the first pitch P1 indicates a distance between the first barriers 252a which are adjacent to each other at one side section, and may correspond to a width of the liquid crystal cell 251 surrounded by the first barrier 252a on the plane. The first width W1 indicates a width of the first barrier 252a, and may correspond to a distance between two adjacent liquid crystal cells 251 on the plane.

The first barrier 252a may be formed of a transparent material. Particularly, the first barrier 252a may be made of a polymer polymerized from a monomer 251d included in the liquid crystal cell 251. In one aspect, the monomer 251d may be a photo-hardening monomer. In more detail, the first barrier 252a may be formed in such a manner that the photo-hardening monomers 251d included in the liquid crystal cells are hardened by irradiating UV light. The first barrier 252a formed as above bonds the first substrate 210 to the second substrate 220 in contact with the first alignment film 253 formed on the first substrate 210 and the second alignment film 254 formed on the second substrate 220.

The second barrier 252b is arranged in the second area EGA surrounding the first area IA. At this time, the second area EGA indicates an edge area as shown in FIG. 8. The second barrier 252b has a second pitch P2 and a second width W2 as shown in FIG. 10B. In this case, the second pitch P2 indicates a distance between the second barriers 252b which are adjacent to each other at one side section, and may correspond to a width of the liquid crystal cell 251 surrounded by the second barrier 252b on the plane. The second width W2 indicates a width of the second barrier 252b, and may correspond to a distance between two adjacent liquid crystal cells 251 on the plane.

At this time, the second pitch P2 may be smaller than the first pitch P1. The barrier 252 according to the aspect of the present disclosure may be arranged in the transmissive area TA as well as the emission area EA to partition the liquid crystal cells 251. Therefore, in the aspect of the present disclosure, loss of the light-shielding ratio may occur due to the barrier 252 arranged in the transmissive area TA. This loss of the light-shielding ratio is increased as the area occupied by the barrier 252 is increased. The area for forming the barrier 252 may be determined by at least one of the pitch and the width. If the pitch of the barrier 252 is increased, the area for forming the barrier 252 may be reduced, and if the pitch of the barrier 252 is reduced, the area for forming the barrier 252 may be increased. If the width of the barrier 252 is increased, the area for forming the barrier 252 may be increased, whereas if the width of the barrier 252 is reduced, the area for forming the barrier 252 may be reduced. In the aspect of the present disclosure, the first pitch P1 of the first barrier 252a may be designed at a great size, thereby loss of the light-shielding ratio, which is caused by the first barrier 252a, may be minimized.

On the other hand, the second barrier 252b may have an opened structure at an end of the light controlling device 200 during a cutting process or a scribing process. Therefore, the liquid crystals 251a and the dichroic dyes 251b included in the liquid crystal cell 251 formed at the end of the light controlling device 200 may leak out. If the second pitch P2 of the second barrier 252b is designed at the same size as that of the first barrier 252a, the amount of the liquid crystals 251a and the dichroic dyes 251b, which leak out during the cutting process or the scribing process, is increased, thereby the light controlling device 200 may be contaminated. Also, since an area where the light controlling device 200 cannot control light is increased, a non-display area where an image cannot be displayed may be increased correspondingly. For this reason, a thickness of a bezel may be increased.

As described above, the first barrier 252a may be formed to have the first pitch P1 of a great size, for example, 300 μm to 1 cm, to minimize loss of the light-shielding ratio. On the other hand, the second barrier 252b may be formed to have the second pitch P2 smaller than the first pitch P1, for example, 50 μm to 300 μm, to minimize leakage of the liquid crystals 251a and the dichroic dyes 251b during the cutting process or the scribing process.

Also, the second width W2 may be smaller than the first width W1. If the second pitch P2 of the second barrier 252a is formed to be smaller than the first pitch P1 of the first barrier 252a, the area for forming the second barrier 252b per unit area may be increased, thereby loss of the light-shielding ratio may be increased. To prevent loss of the light-shielding ratio from being increased, the second barrier 252b may have the second width W2 smaller than the first width W1. For example, the first width W1 may be 5 μm to 50 μm, and the second width W2 may be 1 μm to 10 μm.

Meanwhile, each of a ratio of an area for forming the second barrier 252b in the second area EGA and a ratio of an area for forming the first barrier 252a in the first area IA may be less than 10%. Also, the ratio of the area for forming the second barrier 252b in the second area EGA may be the same as the ratio of the area for forming the first barrier 252a in the first area IA. At this time, the same ratio of the areas for forming the barriers may include that there is a slight difference between the ratio of the area for forming the second barrier 252b in the second area EGA and the ratio of the area for forming the first barrier 252a in the first area IA as well as that the ratio of the area for forming the second barrier 252b in the second area EGA is substantially the same as the ratio of the area for forming the first barrier 252a in the first area IA. For example, the difference between the ratio of the area for forming the second barrier 252b in the second area EGA and the ratio of the area for forming the first barrier 252a in the first area IA may be less than 1%.

As described above, the area for forming the second barrier 252b per unit area and the area for forming the first barrier 252a per unit area are the same as each other or their difference is small, thereby loss of the light-shielding ratio may be the same or a slight difference between the first area IA and the second area EGA. That is, the first area IA and the second area EGA may have the same light-shielding ratio in the light-shielding mode, or may have a slight difference in a light-shielding ratio in the light-shielding mode. Likewise, the first area IA and the second area EGA may have the same light transmittance in the transmissive mode, or may have a slight difference in light transmittance in the transmissive mode.

Therefore, in the present disclosure, even though the first area IA and the second area EGA are arranged to overlap the display area DA where an image is displayed, a viewer cannot recognize the difference between the first area IA and the second area EGA in the light-shielding mode or the transmissive mode.

The second barrier 252b may be formed of a transparent material. Particularly, the second barrier 252b may be made of a polymer polymerized from a monomer 251d included in the liquid crystal cell 251. In one aspect, the monomer 251d may be a photo-hardening monomer. In more detail, the second barrier 252b may be formed in such a manner that the photo-hardening monomers 251d included in the liquid crystal cells 251 are hardened by irradiating UV light. The second barrier 252b formed as above bonds the first substrate 210 to the second substrate 220 in contact with the first alignment film 253 formed on the first substrate 210 and the second alignment film 254 formed on the second substrate 220.

The first alignment film 253 is provided on one surface of the first electrode 230 which faces the second substrate 220. The second alignment film 254 is provided on one surface of the second electrode 240 which faces the first substrate 210. The first and second alignment films 253 and 254 may be vertical alignment films for arranging a long-axis direction of the liquid crystals 251a and the dichroic dyes 251d in a vertical direction (Z-axis direction) if no voltage is applied to each of the first and second electrodes 230 and 240.

In the aspect of the present disclosure, the barrier 252 may be formed in a closed structure to partition the liquid crystal cells 251. Therefore, the liquid crystals 251a and the dichroic dyes 251b included in the liquid crystal cells 251 may be prevented from being concentrated on one side, and the ratio of the liquid crystals 251a and the dichroic dyes 251b per liquid crystal cell 251 may be maintained uniformly, thereby the light-shielding ratio in the light-shielding mode may be realized uniformly.

Also, in the aspect of the present disclosure, the photo-hardening monomer may be hardened to form the first barrier 252a and the second barrier 252b, thereby the first substrate 210 and the second substrate 220 may easily be bonded to each other without a separate adhesive layer.

Also, in the aspect of the present disclosure, since the first barrier 252a and the second barrier 252b are formed in the entire area of the light controlling device 200, their contact areas with the first substrate 210 and the second substrate 220 are great. Therefore, adhesion between the first substrate 210 and the second substrate 220 may be improved.

Also, in the aspect of the present disclosure, the pitch of the first barrier 252a is formed at a great size, thereby loss of the light-shielding ratio, which is caused by the first barrier 252a, may be minimized. Meanwhile, in the aspect of the present disclosure, the pitch of the second barrier 252b is formed to be smaller than that of the first barrier 252a, thereby the liquid crystal material, which leaks out at the end of the light controlling device during the cutting process or the scribing process, may be minimized.

Also, in the aspect of the present disclosure, the width of the second barrier 252b is formed to be smaller than that of the first barrier 252a, thereby loss of the light-shielding ratio in the second area EGA may be reduced.

Also, in the aspect of the present disclosure, the area for forming the first barrier 252a per unit area and the area for forming the second barrier 252b per unit area are the same as each other or their difference is small, thereby the same light transmittance as that of the first area IA may be obtained in the second area EGA. Therefore, in the transparent display device according to the aspect of the present disclosure, the display area DA where an image is displayed may be formed in the second area EGA as well as the first area IA.

Also, in the aspect of the present disclosure, the second barrier 252b not the sealant is formed at the edge area to bond the first substrate 210 to the second substrate 220, thereby the thickness of the bezel may be minimized.

Also, in the aspect of the present disclosure, since the first substrate 210 is bonded to the second substrate 220 without a sealant, the first substrate 210 may be bonded to the second substrate 220 by a roll to roll process. Therefore, even though the transparent display device has a large size, the first substrate 210 may easily be bonded to the second substrate 220.

Second Aspect

Figure 11:
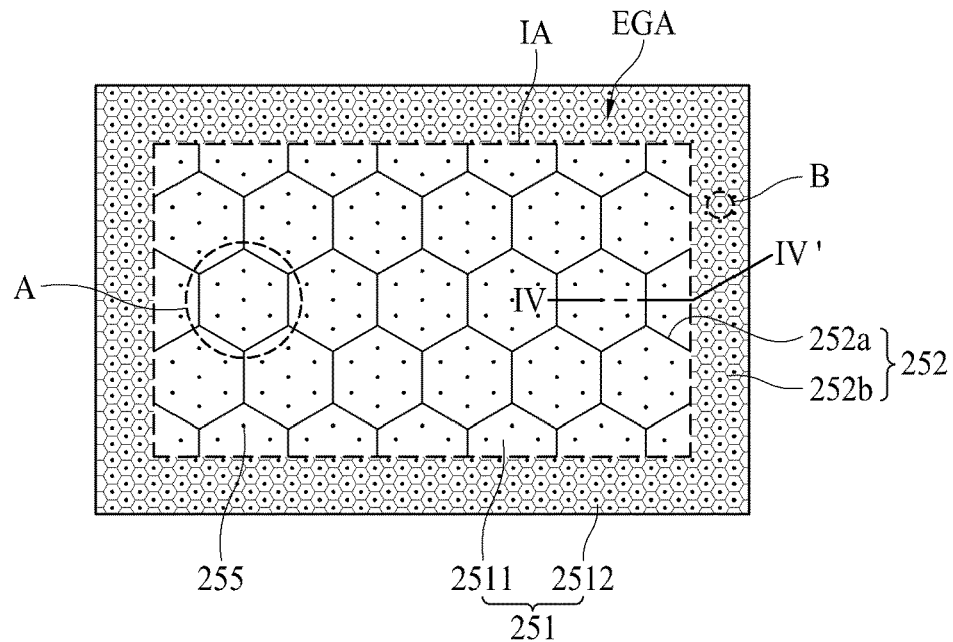
FIG. 11 is a plan view illustrating a second aspect of a liquid crystal layer shown in FIG. 7.
Figure 12:
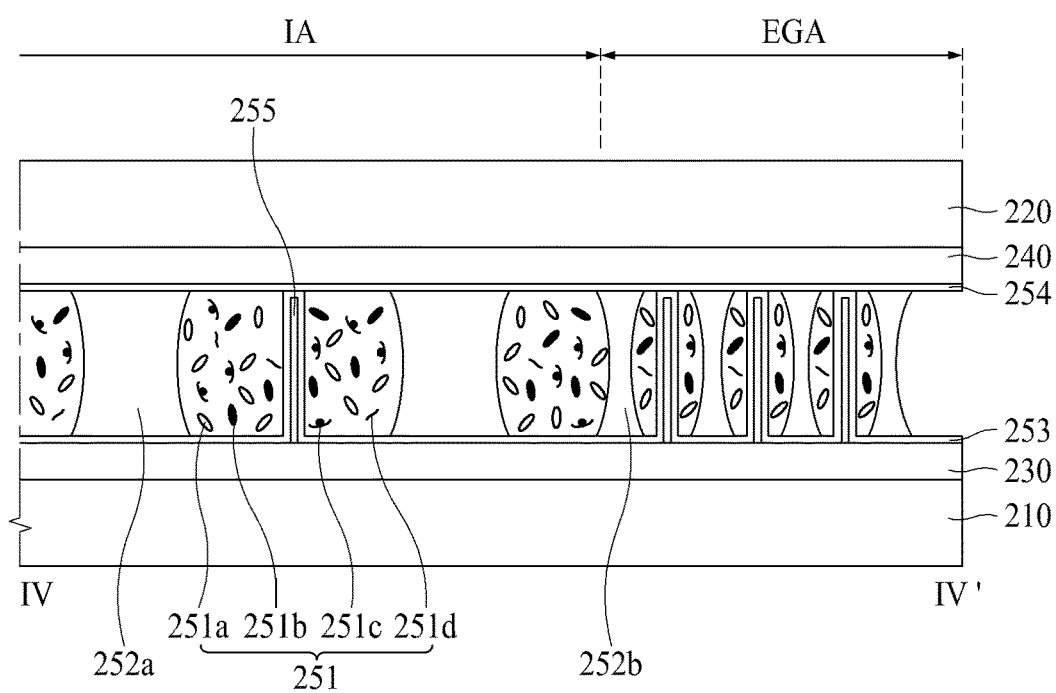
FIG. 12 is a cross-sectional view along line IV-IV' of FIG. 11.
Figure 13A:
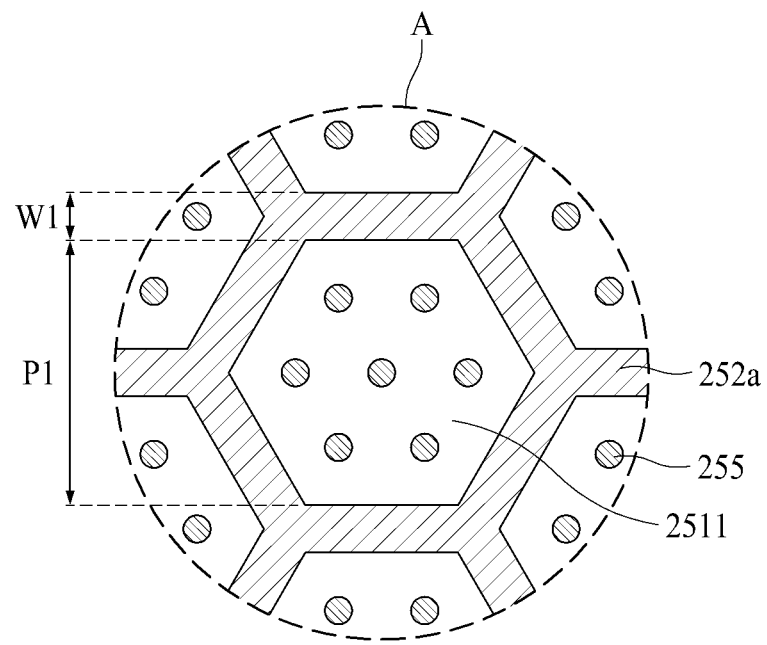
FIG. 13A is an enlarged view illustrating an area A of FIG. 11.
Figure 13B:
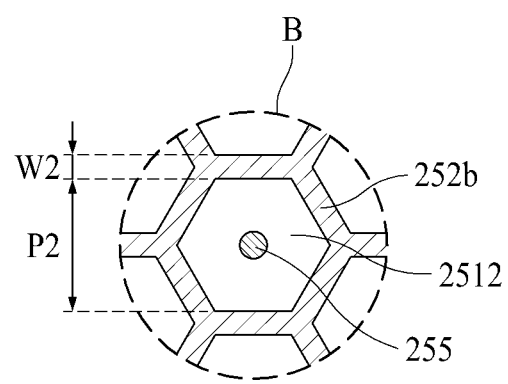
FIG. 13B is an enlarged view illustrating an area B of FIG. 11.
Figure 14:
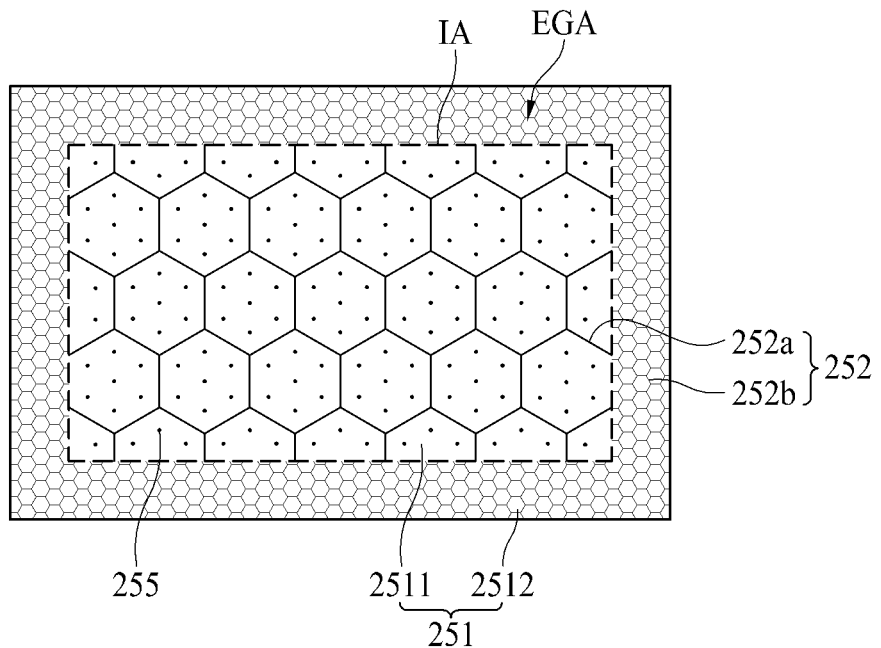
FIG. 14 is a plan view illustrating a modified aspect of FIG. 11.

FIG. 11 is a plan view illustrating a second aspect of a liquid crystal layer shown in FIG. 7. FIG. 12 is a cross-sectional view along line IV-IV' of FIG. 11, FIG. 13A is an enlarged view illustrating an area A of FIG. 11, and FIG. 13B is an enlarged view illustrating an area B of FIG. 11. FIG. 14 is a plan view illustrating a modified aspect of FIG. 11. For convenience of description, although the liquid crystal layer 250 is realized as a dynamic scattering mode liquid crystal layer, the liquid crystal layer 250 may be realized as various liquid crystal layers such as a guest host liquid crystal layer and a polymer network liquid crystal layer.

The liquid crystal layer 250 according to the second aspect is different from that according to the first aspect in that it further includes spacers 255. Hereinafter, description will be focused on the spacers, and the same description as that of the first aspect will be omitted.

Referring to FIGS. 11 and 12, the liquid crystal layer 250 may include liquid crystal cells 251, barriers 252, a first alignment film 253, a second alignment film 254, and spacers 255.

The liquid crystal cells 251 include liquid crystals 251a, dichroic dyes 251b, ion materials 251c, monomers 251d, and a photo-initiator (not shown).

The barrier 252 is arranged between the first substrate 210 and the second substrate 220, and serves to partition the liquid crystal cells 251. In more detail, the barrier 252 has a closed structure to partition the liquid crystal cells 251. The barrier 252 may have a closed structure of which plane type surrounds an n-angulated (n is a positive integer of 3 or more) shape.

As described above, in the present disclosure, the barrier 252 is formed by a closed structure not an opened structure such as a stripe, thereby the liquid crystals 251a and the dichroic dyes 251b included in one liquid crystal cell 251 may be prevented from moving to another adjacent liquid crystal cell 251 by gravity. Therefore, the liquid crystals 251a and the dichroic dyes 251b may be distributed uniformly without being concentrated on one side. As a result, in the present disclosure, a ratio of the liquid crystals 251a and the dichroic dyes 251b may be maintained uniformly within the light controlling device 200 by the barrier 252.

The barrier 252 includes a first barrier 252a arranged in a first area IA and a second barrier 252b arranged in a second area EGA.

The first barrier 252a is arranged in the first area IA. At this time, the first area IA indicates an inner area as shown in FIG. 11. The first barrier 252a has a first pitch P1 and a first width W1 as shown in FIG. 13A.

The first barrier 252a may be formed of a transparent material. Particularly, the first barrier 252a may be made of a polymer polymerized from a monomer 251d included in the liquid crystal cell 251. In one aspect, the monomer 251d may be a photo-hardening monomer. In more detail, the first barrier 252a may be formed in such a manner that the photo-hardening monomers 251d included in the liquid crystal cells are hardened by irradiating UV light. The first barrier 252a formed as above bonds the first substrate 210 to the second substrate 220 in contact with the first alignment film 253 formed on the first substrate 210 and the second alignment film 254 formed on the second substrate 220.

The second barrier 252b is arranged in the second area EGA surrounding the first area IA. At this time, the second area EGA indicates an edge area as shown in FIG. 11. The second barrier 252b has a second pitch P2 and a second width W2 as shown in FIG. 13B.

At this time, the second pitch P2 may be smaller than the first pitch P1. In the aspect of the present disclosure, the first pitch P1 of the first barrier 252a may be designed at a great size, thereby loss of the light-shielding ratio, which is caused by the first barrier 252a, may be minimized. On the other hand, the second barrier 252b may have an opened structure at an end of the light controlling device 200 during a cutting process or a scribing process. Therefore, the liquid crystals 251a and the dichroic dyes 251b included in the liquid crystal cell 251 formed at the end of the light controlling device 200 may leak out. In the aspect of the present disclosure, the second barrier 252b may be formed to have the second pitch P2 smaller than the first pitch P1 to minimize leakage of the liquid crystals 251a and the dichroic dyes 251b during the cutting process or the scribing process.

Also, the second width W2 may be smaller than the first width W1. If the second pitch P2 of the second barrier 252a is formed to be smaller than the first pitch P1 of the first barrier 252a, the area for forming the second barrier 252b per unit area may be increased, thereby loss of the light-shielding ratio may be increased. To prevent loss of the light-shielding ratio from being increased, the second barrier 252b may have the second width W2 smaller than the first width W1.

The second barrier 252b may be formed of a transparent material. Particularly, the second barrier 252b may be made of a polymer polymerized from a monomer 251d included in the liquid crystal cell 251. In one aspect, the monomer 251d may be a photo-hardening monomer. In more detail, the second barrier 252b may be formed in such a manner that the photo-hardening monomers 251d included in the liquid crystal cells 251 are hardened by irradiating UV light. The second barrier 252b formed as above bonds the first substrate 210 to the second substrate 220 in contact with the first alignment film 253 formed on the first substrate 210 and the second alignment film 254 formed on the second substrate 220.

The spacers 255 are arranged in the liquid crystal cells 251 to maintain a cell gap of the liquid crystal cells 251. In more detail, the spacers 255 are arranged in the first liquid crystal cell 2511 partitioned by the first barrier 252a to maintain a cell gap of the first liquid crystal cell 2511 or is arranged in the second liquid crystal cell 2512 partitioned by the second barrier 252b to maintain a cell gap of the second liquid crystal cell 2512. The spacers 255 may be arranged on one surface of the first substrate 210 which faces the second substrate 220, or may be arranged between the first barriers 252a or between the second barriers 252b.

In the aspect of the present disclosure, the first pitch P1 of the first barrier 252a may be formed at a great size to minimize loss of the light-shielding ratio, which is caused by the first barrier 252a. At this time, if the first pitch P1 of the first barrier 252a is too great, it may be difficult to maintain a cell gap when a pressure is given to the liquid crystal cell 251. To prevent this, in the aspect of the present disclosure, the spacer 255 is formed between the first barriers 252a, thereby the cell gap of the first liquid crystal cells 2511 may be maintained.

In the aspect of the present disclosure, the second pitch P2 of the second barrier 252b may be formed at a small size to minimize liquid crystal materials which leak out during the cutting process or the scribing process. At this time, if the second pitch P2 of the second barrier 252b is small, the area for forming the second barrier 252b per unit area may be increased. Therefore, in the aspect of the present disclosure, the spacers 255 formed in the second liquid crystal cell 2512 may be smaller than those formed in the first liquid crystal cell 2511.

Although the spacer 255 is formed even in the second liquid crystal cell 2512 in FIG. 11, the present disclosure is not limited to the aspect of FIG. 11 In another aspect, the spacer 255 may be formed only in the first liquid crystal cell 2511 but may not be formed in the second liquid crystal cell 2512 as shown in FIG. 14. Therefore, loss of the light-shielding ratio in the second area EGA may be minimized.

The spacers 255 may be formed of a transparent material. At this time, the spacers 255 may be formed of, but not limited to, photo resist.

Meanwhile, each of a ratio of an area for forming the second barrier 252b and the spacers 255 in the second area EGA and a ratio of an area for forming the first barrier 252a and the spacers 255 in the first area IA may be less than 10%. Also, the ratio of the area for forming the second barrier 252b and the spacers 255 in the second area EGA may be the same as the ratio of the area for forming the first barrier 252a and the spacers 255 in the first area IA. At this time, the same ratio of the areas for forming the barriers and the spacers per unit area may include that there is a slight difference between the ratio of the area for forming the second barrier 252b and the spacers 255 in the second area EGA and the ratio of the area for forming the first barrier 252a and the spacers 255 in the first area IA as well as that the ratio of the area for forming the second barrier 252b and the spacers 255 in the second area EGA is substantially the same as the ratio of the area for forming the first barrier 252a and the spacers 255 in the first area IA. For example, the difference between the ratio of the area for forming the second barrier 252b and the spacers 255 in the second area EGA and the ratio of the area for forming the first barrier 252a and the spacers 255 in the first area IA may be less than 1%.

As a result, loss of the light-shielding ratio may be the same or a slight difference between the first area IA and the second area EGA. That is, the first area IA and the second area EGA may have the same light-shieling ratio in the light-shielding mode, or may have a slight difference in a light-shielding ratio in the light-shielding mode. Likewise, the first area IA and the second area EGA may have the same light transmittance in the transmissive mode, or may have a slight difference in light transmittance in the transmissive mode.

Therefore, in the present disclosure, even though the first area IA and the second area EGA are arranged to overlap the display area DA where an image is displayed, a viewer cannot recognize the difference between the first area IA and the second area EGA in the light-shielding mode or the transmissive mode.

The first alignment film 253 is provided on one surface of the first electrode 230 which faces the second substrate 220 and the spacers 255. The second alignment film 254 is provided on one surface of the second electrode 240 which faces the first substrate 210. The first and second alignment films 253 and 254 may be vertical alignment films for arranging a long-axis direction of the liquid crystals 251a and the dichroic dyes 251d in a vertical direction (Z-axis direction) if no voltage is applied to each of the first and second electrodes 230 and 240.

In the aspect of the present disclosure, as the spacers 255 may be formed in the liquid crystal cell 251, the first pitch of the first barrier 252a may be formed at a great size, thereby a light-shielding ratio of a certain level may be obtained and at the same time a cell gap may be maintained uniformly.

Also, in the aspect of the present disclosure, the spacers 255 formed in the second liquid crystal cell 2512 are smaller than those formed in the first liquid crystal cell 2511, thereby loss of the light-shielding ratio in the second area EGA may be minimized.

Third Aspect

Figure 15:
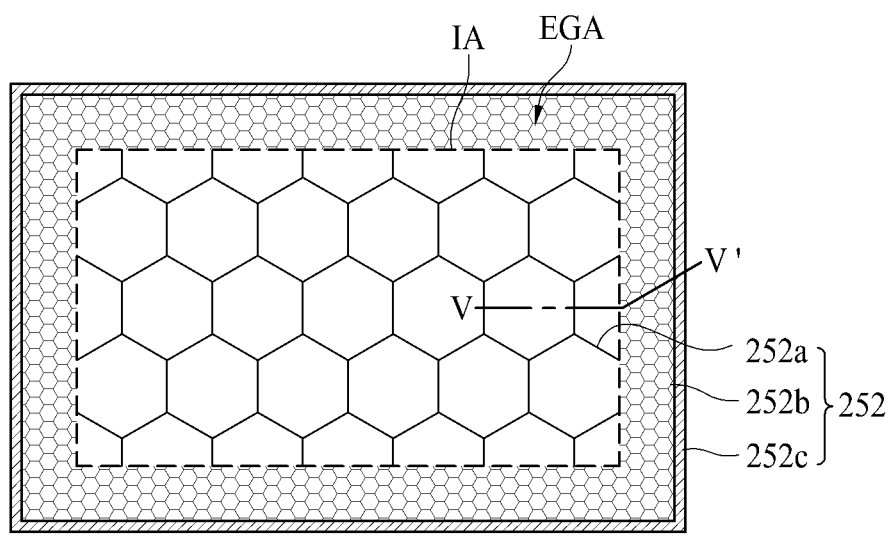
FIG. 15 is a plan view illustrating a third aspect of a liquid crystal layer shown in FIG. 7.
Figure 16:
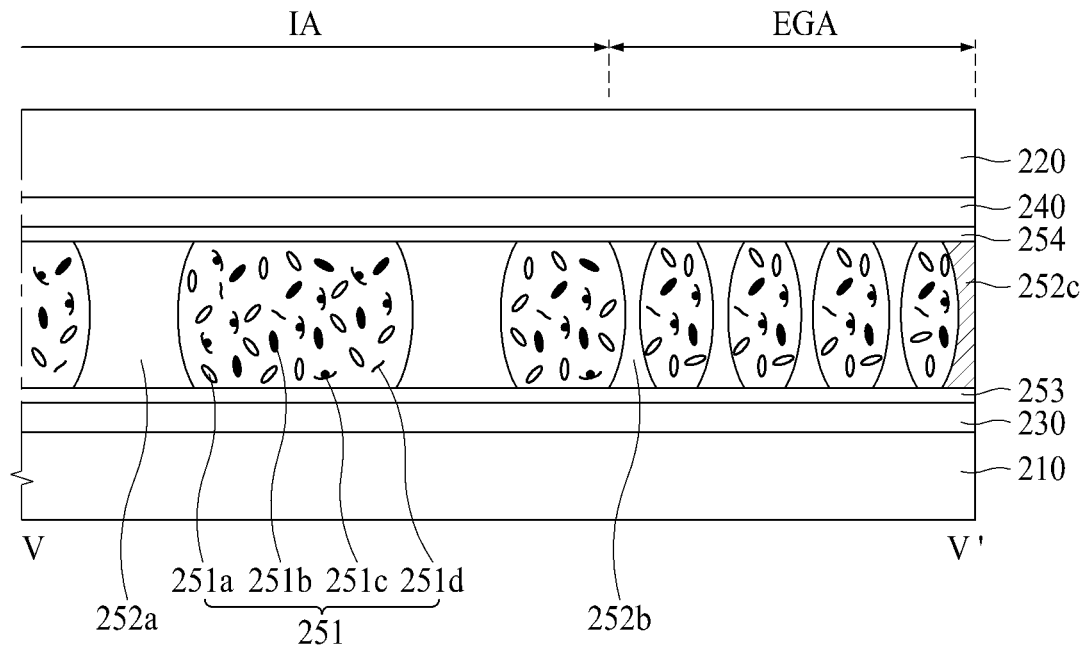
FIG. 16 is a cross-sectional view along line V-V' of FIG. 15.

FIG. 15 is a plan view illustrating a third aspect of a liquid crystal layer shown in FIG. 7. FIG. 16 is a cross-sectional view along line V-V' of FIG. 15. For convenience of description, although the liquid crystal layer 250 is realized as a dynamic scattering mode liquid crystal layer, the liquid crystal layer 250 may be realized as various liquid crystal layers such as a guest host liquid crystal layer and a polymer network liquid crystal layer.

The liquid crystal layer 250 according to the third aspect is different from that according to the first aspect in that it further includes a third barrier 252c. Hereinafter, description will be focused on the barriers 252, and the same description as that of the first aspect will be omitted.

Referring to FIGS. 15 and 16, the liquid crystal layer 250 may include liquid crystal cells 251, barriers 252, a first alignment film 253, and a second alignment film 254.

The liquid crystal cells 251 include liquid crystals 251a, dichroic dyes 251b, ion materials 251c, monomers 251d, and a photo-initiator (not shown).

The barrier 252 is arranged between the first substrate 210 and the second substrate 220, and serves to partition the liquid crystal cells 251. In more detail, the barrier 252 has a closed structure to partition the liquid crystal cells 251. The barrier 252 may have a closed structure of which plane type surrounds an n-angulated (n is a positive integer of 3 or more) shape.

As described above, in the present disclosure, the barrier 252 is formed by a closed structure not an opened structure such as a stripe, thereby the liquid crystals 251a and the dichroic dyes 251b included in one liquid crystal cell 251 may be prevented from moving to another adjacent liquid crystal cell 251 by gravity. Therefore, the liquid crystals 251a and the dichroic dyes 251b may be distributed uniformly without being concentrated on one side. As a result, in the present disclosure, a ratio of the liquid crystals 251a and the dichroic dyes 251b may be maintained uniformly within the light controlling device 200 by the barrier 252.

The barrier 252 includes a first barrier 252a arranged in a first area IA, a second barrier 252b arranged in a second area EGA, and a third barrier 252c arranged on an edge.

The first barrier 252a is arranged in the first area IA. At this time, the first area IA indicates an inner area as shown in FIG. 15. The first barrier 252a has a first pitch P1 and a first width W1.

The first barrier 252a may be formed of a transparent material. Particularly, the first barrier 252a may be made of a polymer polymerized from a monomer 251d included in the liquid crystal cell 251. In one aspect, the monomer 251d may be a photo-hardening monomer. In more detail, the first barrier 252a may be formed in such a manner that the photo-hardening monomers 251d included in the liquid crystal cells are hardened by irradiating UV light. The first barrier 252a formed as above bonds the first substrate 210 to the second substrate 220 in contact with the first alignment film 253 formed on the first substrate 210 and the second alignment film 254 formed on the second substrate 220.

The second barrier 252b is arranged in the second area EGA surrounding the first area IA. At this time, the second area EGA indicates an edge area as shown in FIG. 15. The second barrier 252b has a second pitch P2 and a second width W2.

At this time, the second pitch P2 may be smaller than the first pitch P1. In the aspect of the present disclosure, the first pitch P1 of the first barrier 252a may be designed at a great size, thereby loss of the light-shielding ratio, which is caused by the first barrier 252a, may be minimized. On the other hand, the second barrier 252b may have an opened structure at an end of the light controlling device 200 during a cutting process or a scribing process. Therefore, the liquid crystals 251a and the dichroic dyes 251b included in the liquid crystal cell 251 formed at the end of the light controlling device 200 may leak out. In the aspect of the present disclosure, the second pitch P2 of the second barrier 252b may be formed to be smaller than the first pitch P1 to minimize leakage of the liquid crystals 251a and the dichroic dyes 251b during the cutting process or the scribing process.

Also, the second width W2 may be smaller than the first width W1. If the second pitch P2 of the second barrier 252a is formed to be smaller than the first pitch P1 of the first barrier 252a, the area for forming the second barrier 252b per unit area may be increased, thereby loss of the light-shielding ratio may be increased. To prevent loss of the light-shielding ratio from being increased, the second barrier 252b may have the second width W2 smaller than the first width W1.

Meanwhile, each of a ratio of an area for forming the second barrier 252b in the second area EGA and a ratio of an area for forming the first barrier 252a in the first area IA may be less than 10%. Also, the ratio of the area for forming the second barrier 252b in the second area EGA may be the same as the ratio of the area for forming the first barrier 252a in the first area IA. At this time, the same ratio of the areas for forming the barriers may include that there is a slight difference between the ratio of the area for forming the second barrier 252b in the second area EGA and the ratio of the area for forming the first barrier 252a in the first area IA as well as that the ratio of the area for forming the second barrier 252b in the second area EGA is substantially the same as the ratio of the area for forming the first barrier 252a in the first area IA. For example, the difference between the ratio of the area for forming the second barrier 252b in the second area EGA and the ratio of the area for forming the first barrier 252a in the first area IA may be less than 1%.

As a result, the light-shielding ratio may be the same or a slight difference between the first area IA and the second area EGA. That is, the first area IA and the second area EGA may have the same light-shielding ratio in the light-shielding mode, or may have a slight difference in a light-shielding ratio in the light-shielding mode. Likewise, the first area IA and the second area EGA may have the same light transmittance in the transmissive mode, or may have a slight difference in light transmittance in the transmissive mode.

Therefore, in the present disclosure, even though the first area IA and the second area EGA are arranged to overlap the display area DA where an image is displayed, a viewer cannot recognize the difference between the first area IA and the second area EGA in the light-shielding mode or the transmissive mode.

The second barrier 252b may be formed of a transparent material. Particularly, the second barrier 252b may be made of a polymer polymerized from a monomer 251d included in the liquid crystal cell 251. In one aspect, the monomer 251d may be a photo-hardening monomer. In more detail, the second barrier 252b may be formed in such a manner that the photo-hardening monomers 251d included in the liquid crystal cells 251 are hardened by irradiating UV light. The second barrier 252b formed as above bonds the first substrate 210 to the second substrate 220 in contact with the first alignment film 253 formed on the first substrate 210 and the second alignment film 254 formed on the second substrate 220.

The third barrier 252c is arranged on the edge. At this time, the corner indicates an edge of the light controlling device 200 as shown in FIG. 15. The third barrier 252c surrounds the edge of the light controlling device 200 at a third width. At this time, the third width may correspond to the bezel thickness of the transparent display device, and may be the same as or different from the second width W2 of the second barrier 252b.

The third barrier 252c may be formed of a transparent material. Particularly, the third barrier 252c may be made of a polymer polymerized from a monomer 251d included in the liquid crystal cell 251. In one aspect, the monomer 251d may be a photo-hardening monomer. In more detail, the third barrier 252c may be formed in such a manner that the photo-hardening monomers 251d included in the liquid crystal cells 251 are hardened by irradiating UV light. The third barrier 252c formed as above bonds the first substrate 210 to the second substrate 220 in contact with the first alignment film 253 formed on the first substrate 210 and the second alignment film 254 formed on the second substrate 220.

In the aspect of the present disclosure, the third barrier 252c formed to surround the edge may prevent the liquid crystal material from leaking out of the end, that is, the edge of the light controlling device 200 during the cutting process or the scribing process. Therefore, in the aspect of the present disclosure, foreign materials may be prevented from being permeated into a space where the liquid crystal material leaks out of the edge of the light controlling device 200.

Also, in the aspect of the present disclosure, adhesion between the first substrate 210 and the second substrate 220 may be improved at the edge of the light controlling device 200.

Fourth Aspect

Figure 17:
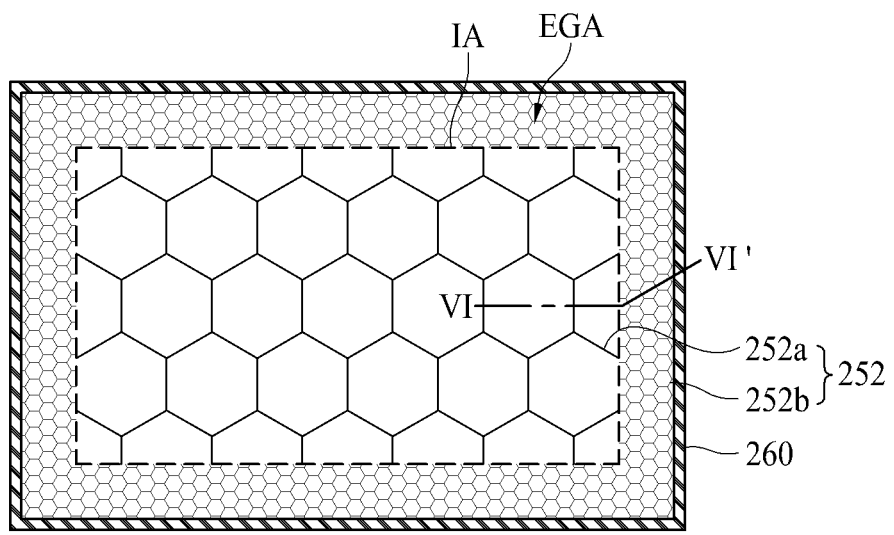
FIG. 17 is a plan view illustrating a fourth aspect of a liquid crystal layer shown in FIG. 7.
Figure 18:
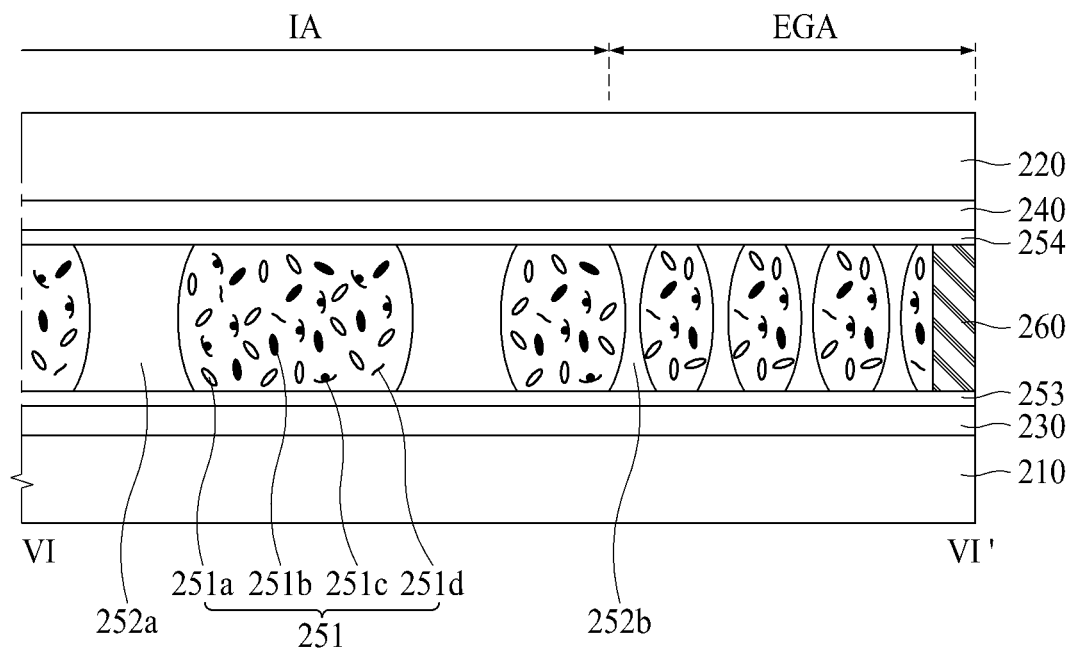
FIG. 18 is a cross-sectional view along line VI-VI' of FIG. 17.

FIG. 17 is a plan view illustrating a fourth aspect of a liquid crystal layer shown in FIG. 7. FIG. 18 is a cross-sectional view along line VI-VI' of FIG. 17. For convenience of description, although the liquid crystal layer 250 is realized as a dynamic scattering mode liquid crystal layer, the liquid crystal layer 250 may be realized as various liquid crystal layers such as a guest host liquid crystal layer and a polymer network liquid crystal layer.

The liquid crystal layer 250 according to the fourth aspect is different from that according to the first aspect in that it further includes a dam 260. Hereinafter, description will be focused on the barriers 252 and the dam 260, and the same description as that of the first aspect will be omitted.

Referring to FIGS. 17 and 18, the liquid crystal layer 250 may include liquid crystal cells 251, barriers 252, a first alignment film 253, a second alignment film 254, and a dam 260.

The liquid crystal cells 251 include liquid crystals 251a, dichroic dyes 251b, ion materials 251c, monomers 251d, and a photo-initiator (not shown).

The barrier 252 is arranged between the first substrate 210 and the second substrate 220, and serves to partition the liquid crystal cells 251. In more detail, the barrier 252 has a closed structure to partition the liquid crystal cells 251. The barrier 252 may have a closed structure of which plane type surrounds an n-angulated (n is a positive integer of 3 or more) shape.

As described above, in the present disclosure, the barrier 252 is formed by a closed structure not an opened structure such as a stripe, thereby the liquid crystals 251a and the dichroic dyes 251b included in one liquid crystal cell 251 may be prevented from moving to another adjacent liquid crystal cell 251 by gravity. Therefore, the liquid crystals 251a and the dichroic dyes 251b may be distributed uniformly without being concentrated on one side. As a result, in the present disclosure, a ratio of the liquid crystals 251a and the dichroic dyes 251b may be maintained uniformly within the light controlling device 200 by the barrier 252.

The barrier 252 includes a first barrier 252a arranged in a first area IA and a second barrier 252b arranged in a second area EGA.

The first barrier 252a is arranged in the first area IA. At this time, the first area IA indicates an inner area as shown in FIG. 17. The first barrier 252a has a first pitch P1 and a first width W1.

The first barrier 252a may be formed of a transparent material. Particularly, the first barrier 252a may be made of a polymer polymerized from a monomer 251d included in the liquid crystal cell 251. In one aspect, the monomer 251d may be a photo-hardening monomer. In more detail, the first barrier 252a may be formed in such a manner that the photo-hardening monomers 251d included in the liquid crystal cells are hardened by irradiating UV light. The first barrier 252a formed as above bonds the first substrate 210 to the second substrate 220 in contact with the first alignment film 253 formed on the first substrate 210 and the second alignment film 254 formed on the second substrate 220.

The second barrier 252b is arranged in the second area EGA surrounding the first area IA. At this time, the second area EGA indicates an edge area as shown in FIG. 17. The second barrier 252b has a second pitch P2 and a second width W2.

At this time, the second pitch P2 may be smaller than the first pitch P1. In the aspect of the present disclosure, the first pitch P1 of the first barrier 252a may be designed at a great size, thereby loss of the light-shielding ratio, which is caused by the first barrier 252a, may be minimized. On the other hand, the second barrier 252b may have an opened structure at an end of the light controlling device 200 during a cutting process or a scribing process. Therefore, the liquid crystals 251a and the dichroic dyes 251b included in the liquid crystal cell 251 formed at the end of the light controlling device 200 may leak out. In the aspect of the present disclosure, the second pitch P2 of the second barrier 252b may be formed to be smaller than the first pitch P1 to minimize leakage of the liquid crystals 251a and the dichroic dyes 251b during the cutting process or the scribing process.

Also, the second width W2 may be smaller than the first width W1. If the second pitch P2 of the second barrier 252a is formed to be smaller than the first pitch P1 of the first barrier 252a, the area for forming the second barrier 252b per unit area may be increased, thereby loss of the light-shielding ratio may be increased. To prevent loss of the light-shielding ratio from being increased, the second barrier 252b may have the second width W2 smaller than the first width W1.

Meanwhile, each of a ratio of an area for forming the second barrier 252b in the second area EGA and a ratio of an area for forming the first barrier 252a in the first area IA may be less than 10%. Also, the ratio of the area for forming the second barrier 252b in the second area EGA may be the same as the ratio of the area for forming the first barrier 252a in the first area IA. At this time, the same ratio of the areas for forming the barriers may include that there is a slight difference between the ratio of the area for forming the second barrier 252b in the second area EGA and the ratio of the area for forming the first barrier 252a in the first area IA as well as that the ratio of the area for forming the second barrier 252b in the second area EGA is substantially the same as the ratio of the area for forming the first barrier 252a in the first area IA. For example, the difference between the ratio of the area for forming the second barrier 252b in the second area EGA and the ratio of the area for forming the first barrier 252a in the first area IA may be less than 1%.

As a result, the first area IA and the second area EGA may have the same light-shielding ratio in the light-shielding mode, or may have a slight difference in the light-shielding ratio in the light-shielding mode. Likewise, the first area IA and the second area EGA may have the same light transmittance in the transmissive mode, or may have a slight difference in light transmittance in the transmissive mode.

Therefore, in the present disclosure, even though the first area IA and the second area EGA are arranged to overlap the display area DA where an image is displayed, a viewer cannot recognize the difference between the first area IA and the second area EGA in the light-shielding mode or the transmissive mode.

The second barrier 252b may be formed of a transparent material. Particularly, the second barrier 252b may be made of a polymer polymerized from a monomer 251d included in the liquid crystal cell 251. In one aspect, the monomer 251d may be a photo-hardening monomer. In more detail, the second barrier 252b may be formed in such a manner that the photo-hardening monomers 251d included in the liquid crystal cells 251 are hardened by irradiating UV light. The second barrier 252b formed as above bonds the first substrate 210 to the second substrate 220 in contact with the first alignment film 253 formed on the first substrate 210 and the second alignment film 254 formed on the second substrate 220.

The dam 260 is arranged at the edge. At this time, the edge indicates a frame of the light controlling device 200 as shown in FIG. 17. The dam 260 surrounds the edge of the light controlling device 200 at a third width. At this time, the third width may correspond to the bezel thickness of the transparent display device, and may be the same as or different from the second width W2 of the second barrier 252b.

The dam 260 may be formed of a transparent material. At this time, the dam 260 may be formed of, but not limited to, photo resist. If spacers 255 are formed in the liquid crystal cell 251, the dam 260 may be formed of the same material as that of the spacers 255, and may also be formed through the same process as that of the spacers.

In the aspect of the present disclosure, as the dam 260 is formed to surround the edge, a flow of a liquid crystal mixture of a liquid crystal state may be stopped during a process of depositing the liquid crystal mixture on the first substrate 210, and the liquid crystal mixture may uniformly be distributed in the light controlling device 200.

Also, in the aspect of the present disclosure, the dam 260 may prevent the liquid crystal material from leaking out of the end of the light controlling device 200 during the cutting process or the scribing process. Therefore, in the aspect of the present disclosure, foreign materials may be prevented from being permeated into a space where the liquid crystal material leaks out of the end of the light controlling device 200.

Figure 19:
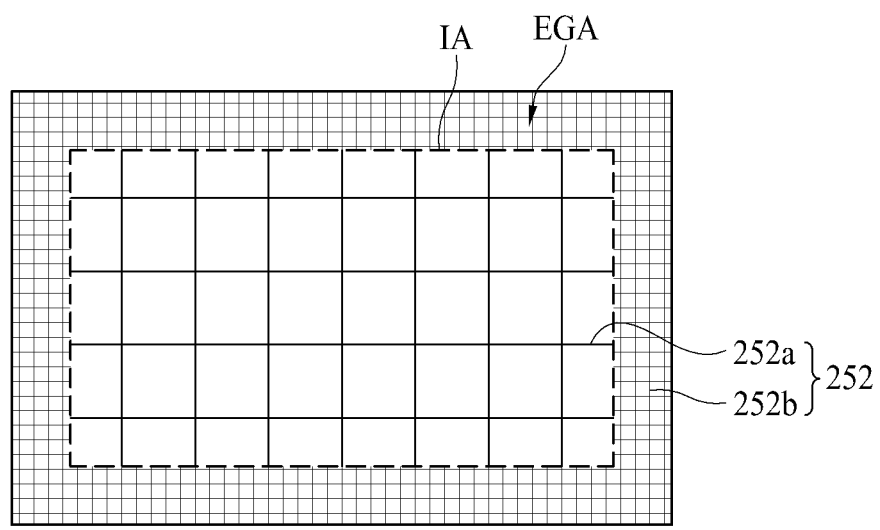
FIG. 19 is a plan view illustrating a fifth aspect of a liquid crystal layer shown in FIG. 7.

Meanwhile, the liquid crystal cell 251 partitioned by the barriers 252 has, but not limited to, a polygonal shape in FIGS. 8 to 18. That is, the liquid crystal cell 251 partitioned by the barriers 252 may be a quadrangle as shown in FIG. 19. Also, the first liquid crystal cell 2511 formed in the first area IA and the second liquid crystal cell 2512 formed in the second area EGA may have, but not limited to, the same shape. That is, the first liquid crystal cell 2511 formed in the first area IA may have a shape different from that of the second liquid crystal cell 2512 formed in the second area EGA. As described above, if the barrier 252 has a closed structure, various modifications may be made in the shape of the liquid crystal cell 251.

Figure 20:
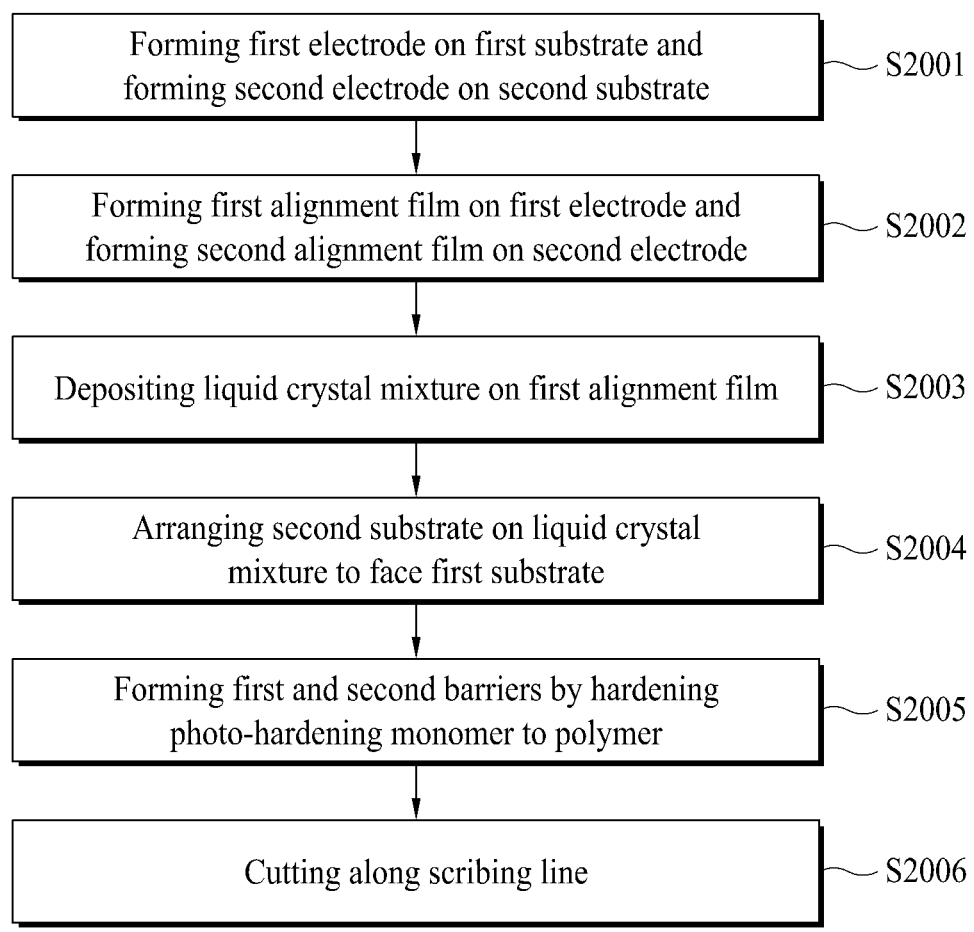
FIG. 20 is a flow chart illustrating a method for fabricating a light controlling device according to the first aspect of the present disclosure.

FIG. 20 is a flow chart illustrating a method for fabricating a light controlling device according to the first aspect of the present disclosure, and FIGS. 21a to 21g are cross-sectional views illustrating a method for fabricating a light controlling device according to the first aspect of the present disclosure.

First of all, a first electrode 230 is formed on one surface of a first substrate 210, and a second electrode 240 is formed on one surface of a second substrate 220 (S2001).

In more detail, as shown in FIG. 21, the first electrode 230 is formed on one surface of the first substrate 210 which faces the second substrate 220, and the second electrode 240 is formed on one surface of the second substrate 220 which faces the first substrate 210.

Each of the first substrate 210 and the second substrate 220 may be a glass substrate or a plastic film. If each of the first substrate 210 and the second substrate 220 is a plastic film, each of the first substrate 210 and the second substrate 220 may be, but not limited to, a sheet or film that includes cellulose resin such as TAC (triacetyl cellulose) or DAC (diacetyl cellulose), COP (cyclic olefin polymer) such as norbornene derivatives, COC (cyclo olefin copolymer), acryl resin such as PMMA (poly(methylmethacrylate)), polyolefin such as PC (polycarbonate), PE (polyethylene) or PP (polypropylene), polyester such as PVA (polyvinyl alcohol), PES (poly ether sulfone), PEEK (polyetheretherketone), PEI (polyetherimide), PEN (polyethylenenaphthalate), and PET (polyethyleneterephthalate), PI (polyimide), PSF (polysulfone), or fluoride resin.

Each of the first and second electrodes 230 and 240 may be, but not limited to, silver oxide (e.g., AgO or $Ag_2O$ or $Ag_2O_3$), aluminum oxide (e.g., $Al_2O_3$), tungsten oxide (e.g., $WO_2$ or $WO_3$ or $W_2O_3$), magnesium oxide (e.g., MgO), molybdenum oxide (e.g., $MoO_3$), zinc oxide (e.g., ZnO), tin oxide (e.g., $SnO_2$), indium oxide (e.g., $In_2O_3$), chrome oxide (e.g., $CrO_3$ or $Cr_2O_3$), antimony oxide (e.g., $Sb_2O_3$ or $Sb_2O_5$), titanium oxide (e.g., $TiO_2$), nickel oxide (e.g., NiO), copper oxide (e.g., CuO or $Cu_2O$), vanadium oxide (e.g., $V_2O_3$ or $V_2O_5$), cobalt oxide (e.g.; CoO), iron oxide (e.g., $Fe_2O_3$ or $Fe_3O_4$), niobium oxide (e.g., $Nb_2O_5$), Indium Tin Oxide (ITO), Indium Zinc Oxide (IZO), Aluminum doped Zinc Oxide (ZAO), Aluminum Tin Oxide (TAO) or Antimony Tin Oxide (ATO).

Next, a first alignment film 253 is formed on the first electrode 230, and a second alignment film 254 is formed on the second electrode 240 (S2002).

Figure 21A:
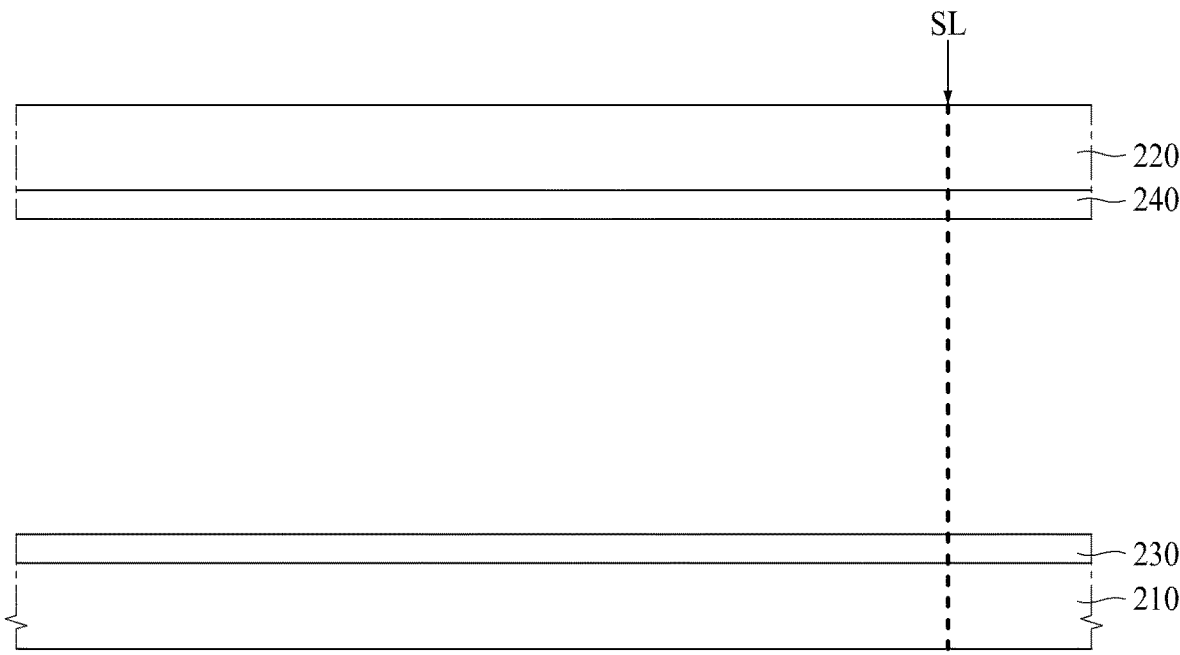
FIGS. 21A to 21F are cross-sectional views illustrating a method for fabricating a light controlling device according to the first aspect of the present disclosure.
Figure 21B:
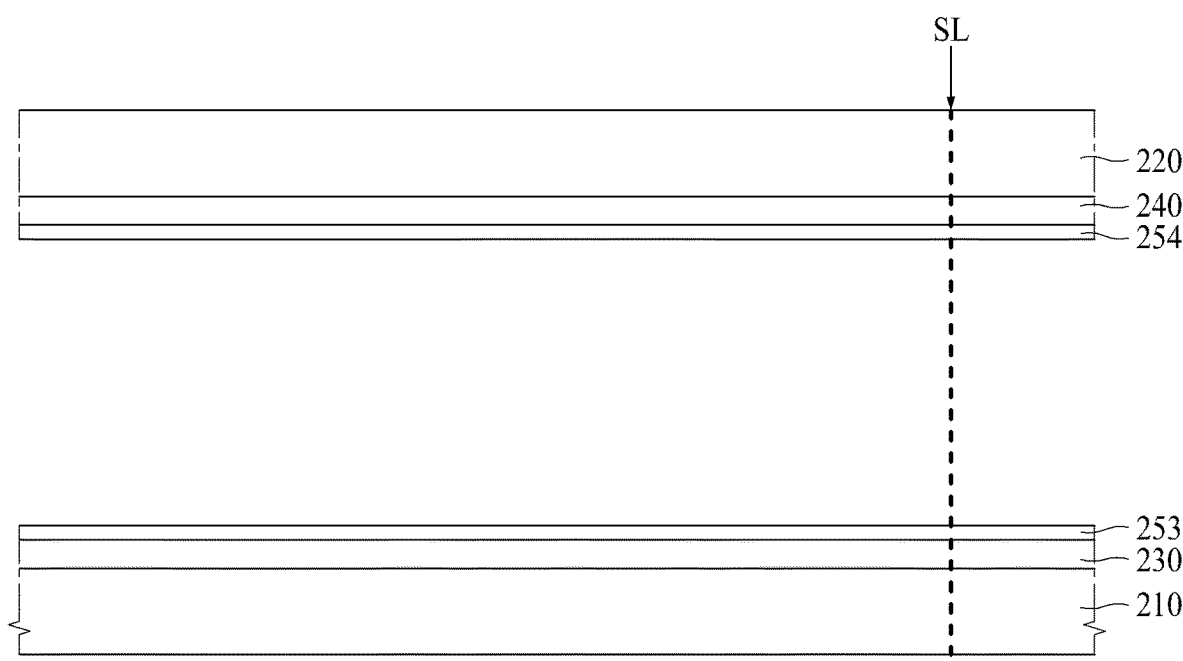

In more detail, the first alignment film 253 is formed on one surface of the first electrode 230 which faces the second substrate 220 as shown in FIG. 21b. Also, the second alignment film 254 is formed on one surface of the second electrode 240 which faces the first substrate 210. The first and second alignment films 253 and 254 may be vertical alignment films for arranging a long-axis direction of liquid crystals 251a and dichroic dyes 251d in a vertical direction (Z-axis direction) if no voltage is applied to each of the first and second electrodes 230 and 240.

Next, a liquid crystal mixture is deposited on the first alignment film 253 (S2003).

Figure 21C:
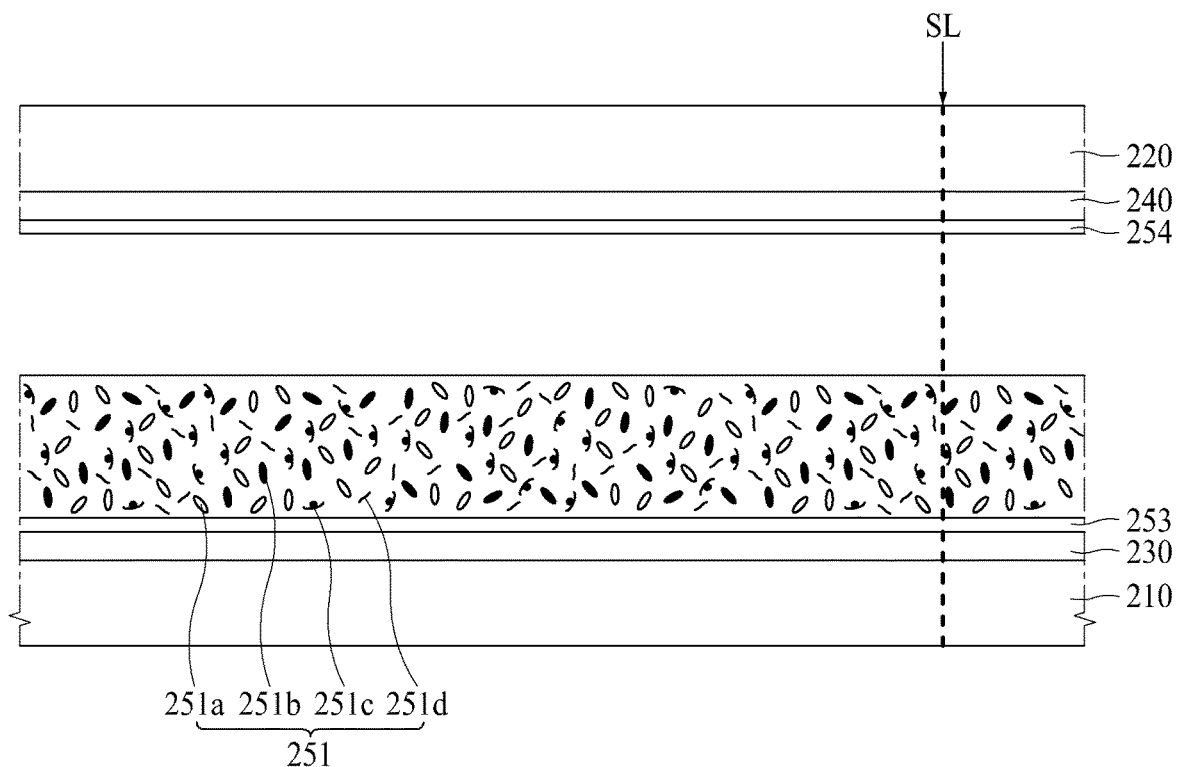

In more detail, the liquid crystal mixture is deposited on the first alignment film 253 as shown in FIG. 21c. A process of filling the liquid crystal mixture may be performed by an inkjet mode.

The liquid crystal mixture includes liquid crystals 251a, dichroic dyes 251b, ion materials 251c, photo-hardening monomers 251d, and a photo-initiator. Since the dichroic dyes 251b absorb UV light, the photo-hardening monomers 251d may not be partially hardened to polymers when UV light is irradiated to the dichroic dyes 251b. For this reason, if the amount of the dichroic dyes 251b is increased, the amount of the photo-hardening monomers 251d remaining in the liquid crystal cell 251 is increased after a first barrier 252a is formed by irradiating UV light during a later process. This could lead to a problem that transmittance of the liquid crystal cell 251 is lowered in the transmissive mode. Therefore, the dichroic dyes 251b may be included in the liquid crystal mixture in the range of 5 wt % or less.

Figure 21D:
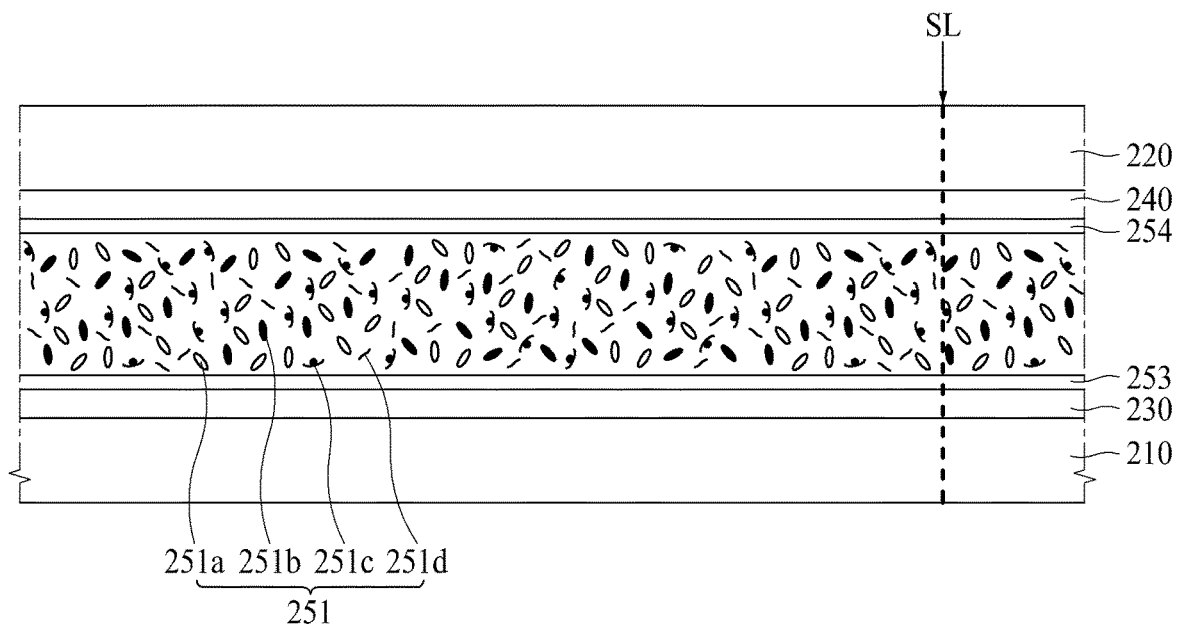
Figure 21E:
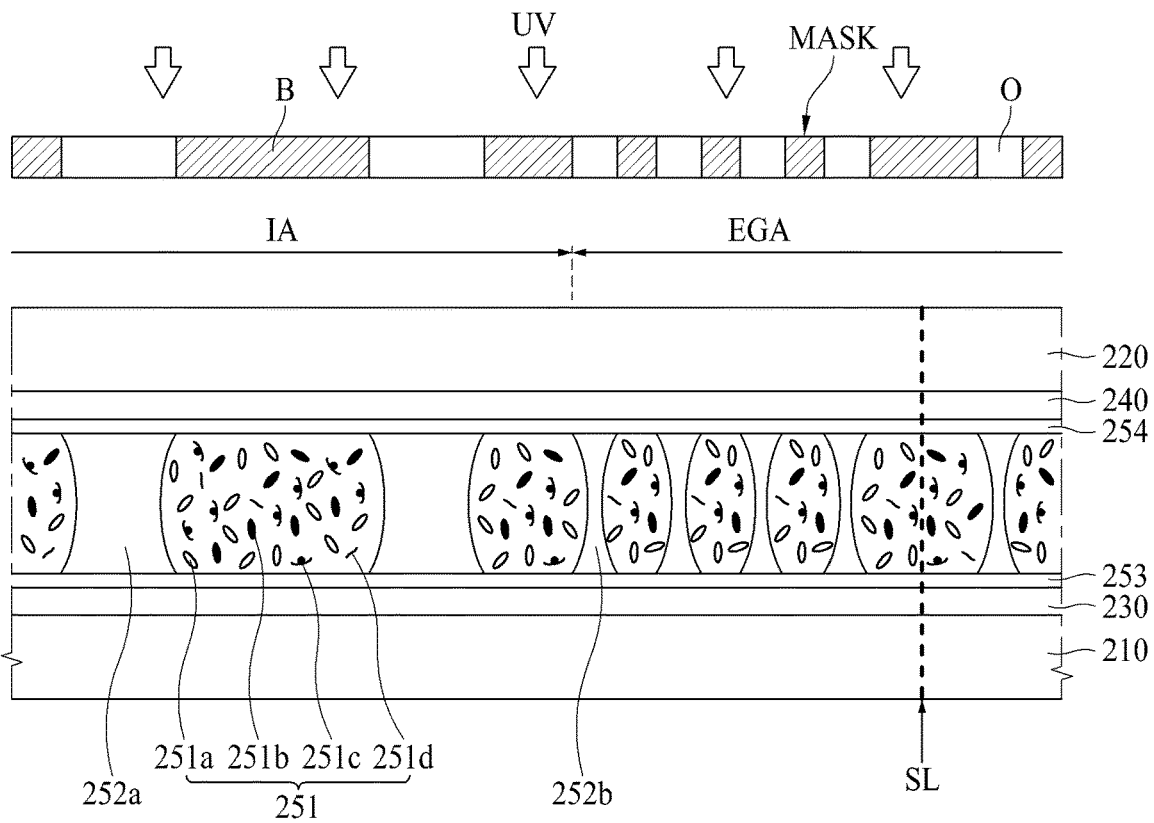

Then, the second substrate 220 is arranged on the liquid crystal mixture to face the first substrate 210 (S2004). In more detail, the second substrate 220 is arranged on the first substrate 210 on which the liquid crystal mixture is formed as shown in FIG. 21d.

Then, the photo-hardening monomer 251d is hardened to polymer, thereby the first barrier 252a and a second barrier 252b are formed (S2005).

In more detail, a mask, which includes opening areas O and blocked areas B, is arranged above the second substrate 220, and photo-hardening monomers 251d are hardened by irradiation of UV light to form the first barrier 252a and the second barrier 252b.

UV light is irradiated to areas corresponding to the opening areas O. The photo-hardening monomers 251d distributed in the liquid crystal cell 251 are hardened by UV light and then polymerized, thereby the first barrier 252a and the second barrier 252b are formed. At this time, the photo-hardening monomers 251d distributed in the area where UV light is irradiated and the photo-hardening monomers 251d distributed in the area where UV light is not irradiated may move to an area where UV light is irradiated, and then may be hardened and polymerized.

Next, the light controlling device 200 is cut along a scribing line SL (S2006).

Figure 21F:
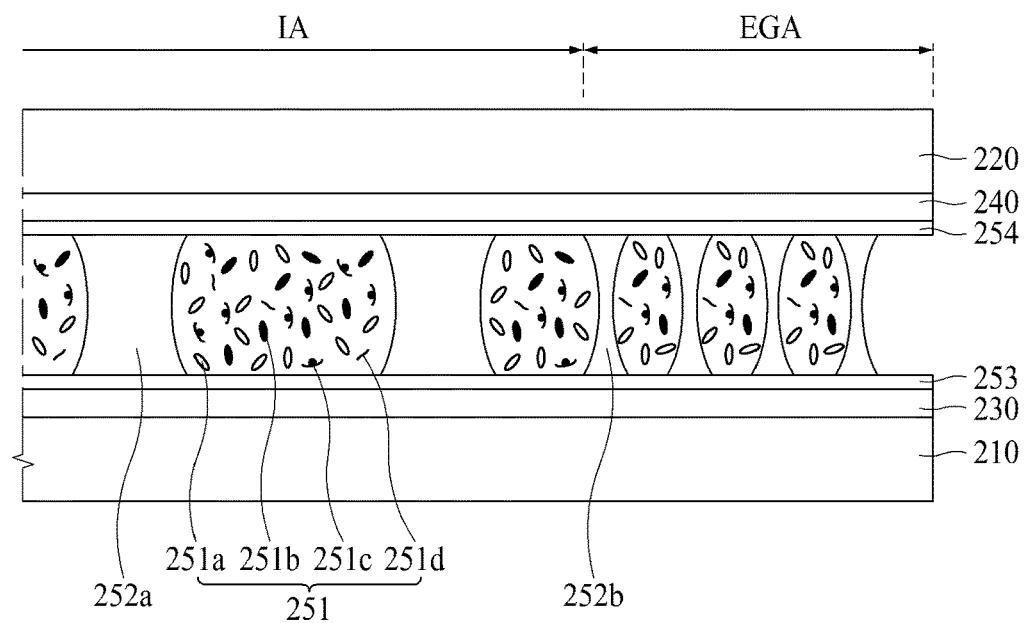

In more detail, if a plurality of light controlling devices is simultaneously fabricated using one mother substrate, a scribing process is performed to separate the plurality of light controlling devices formed on the mother substrate. The scribing line SL is formed between the light controlling devices adjacent to each other, and the light controlling devices are cut along the scribing line SL as shown in FIG. 21f, thereby the respective light controlling devices are separated from each other. At this time, the liquid crystal mixture included in the liquid crystal cell 251 on the scribing line SL is lost.

As described above, according to the present disclosure, the following advantages may be obtained.

In the aspect of the present disclosure, the barrier may be formed in a closed structure to partition the liquid crystal cells. Therefore, the liquid crystals and the dichroic dyes included in the liquid crystal cells may be prevented from being concentrated on one side, and the ratio of the liquid crystals and the dichroic dyes per liquid crystal cell may be maintained uniformly, thereby the light-shielding ratio in the light-shielding mode may be realized uniformly.

Also, in the aspect of the present disclosure, the photo-hardening monomer may be hardened to form the first barrier and the second barrier, thereby the first substrate and the second substrate may easily be bonded to each other without a separate adhesive layer. Also, in the aspect of the present disclosure, as the photo-hardening monomer may be hardened to form the first barrier and the second barrier, the first barrier and the second barrier may have small widths, thereby loss of the light-shielding ratio may be minimized.

Also, in the aspect of the present disclosure, since the first barrier and the second barrier are formed in the entire area of the light controlling device, their contact areas with the first substrate and the second substrate are great. Therefore, adhesion between the first substrate and the second substrate may be improved.

Also, in the aspect of the present disclosure, the pitch of the first barrier is formed at a great size, thereby loss of the light-shielding ratio, which is caused by the first barrier, may be minimized. Meanwhile, in the aspect of the present disclosure, the pitch of the second barrier is formed to be smaller than that of the first barrier, thereby the liquid crystal material, which leaks out at the end of the light controlling device during the cutting process or the scribing process, may be minimized.

Also, in the aspect of the present disclosure, the width of the second barrier is formed to be smaller than that of the first barrier, thereby loss of the light-shielding ratio in the second area may be reduced.

Also, in the aspect of the present disclosure, the area for forming the first barrier per unit area and the area for forming the second barrier per unit area are the same as each other or their difference is small, thereby the same light transmittance as that of the first area may be obtained in the second area. Therefore, in the transparent display device according to the aspect of the present disclosure, the display area where an image is displayed may be formed in the second area as well as the first area.

Also, in the aspect of the present disclosure, the second barrier not the sealant is formed at the edge area to bond the first substrate to the second substrate, thereby the thickness of the bezel may be minimized.

Also, in the aspect of the present disclosure, since the first substrate is bonded to the second substrate without a sealant, the first substrate may be bonded to the second substrate by a roll to roll process. Therefore, even though the transparent display device has a large size, the first substrate may easily be bonded to the second substrate.

In the aspect of the present disclosure, as the spacers may be formed in the liquid crystal cell, the pitch of the first barrier may be formed at a great size, thereby a light-shielding ratio of a certain level may be obtained and at the same time a cell gap may be maintained uniformly.

In the aspect of the present disclosure, the third barrier formed to surround the edge may prevent the liquid crystal material from leaking out of the end, that is, the edge of the light controlling device during the cutting process or the scribing process. Therefore, in the aspect of the present disclosure, foreign materials may be prevented from being permeated into a space where the liquid crystal material leaks out of the edge of the light controlling device.

Also, in the aspect of the present disclosure, adhesion between the first substrate and the second substrate may be improved at the edge of the light controlling device.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light controlling device comprising:
   first and second substrates facing each other;
   a plurality of liquid crystal cells arranged between the first substrate and the second substrate, including a plurality of liquid crystals; and
   a barrier arranged between the first substrate and the second substrate and partitioning the liquid crystal cells,
   wherein the barrier includes a plurality of first barriers arranged in a first area to have a first pitch and a plurality of second barriers arranged in a second area surrounding the first area to have a second pitch, and
   wherein each of the plurality of first barriers is connected with one another and each of the plurality of second barriers is connected with one another, and
   wherein a width of each of the liquid crystal cells surrounded by the second barriers in the second area is smaller than that of each of the liquid crystal cells surrounded by the first barriers in the first area.

2. The light controlling device of claim 1, wherein the second pitch is smaller than the first pitch.

3. The light controlling device of claim 1, wherein each of the second barriers has a width smaller than that of each the first barriers.

4. The light controlling device of claim 1, wherein a ratio of an area for forming each of the first barriers in the first area and a ratio of an area for forming each of the second barriers in the second area are the same as each other or different from each other in a range less than 1%.

5. The light controlling device of claim 1, wherein the plurality of liquid crystal cells partitioned by the barrier has a polygonal shape.

6. The light controlling device of claim 1, wherein the plurality of liquid crystal cells further include a monomer, and the first and the second barriers are polymerized from the monomer.

7. The light controlling device of claim 1, further comprising a third barrier arranged at an edge and surrounding the second area.

8. The light controlling device of claim 7, further comprising a monomer in the plurality of liquid crystal cells, and the first, second and third barriers are polymerized from the monomer.

9. The light controlling device of claim 1, further comprising a photo-initiator in the plurality of liquid crystal cells.

10. The light controlling device of claim 1, wherein the barrier further includes a dam surrounding the second area.

11. The light controlling device of claim 1, further comprising a plurality of spacers arranged in at least one of the plurality of liquid crystal cells.

12. The light controlling device of claim 11, wherein the plurality of liquid crystal cells include a first liquid crystal cell partitioned by the plurality of first barriers and a second liquid crystal cell partitioned by the plurality of second barriers, and the number of the plurality of spacers arranged in the second liquid crystal cell is smaller than those arranged in the first liquid crystal cell.

13. The light controlling device of claim 11, wherein the plurality of liquid crystal cells include a first liquid crystal cell partitioned by the plurality of first barriers and a second liquid crystal cell partitioned by the plurality of second barriers, and the at least one of the plurality of spacers is arranged in the first liquid crystal cell.

14. The light controlling device of claim 1, wherein the first area and the second area overlap a display area of a transparent display panel where an image is displayed.

* * * * *